US005903469A

United States Patent [19]

Ho

[11] Patent Number: 5,903,469
[45] Date of Patent: *May 11, 1999

[54] METHOD OF EXTRACTING LAYOUT PARASITICS FOR NETS OF AN INTEGRATED CIRCUIT USING A CONNECTIVITY-BASED APPROACH

[75] Inventor: William Wai Yan Ho, San Jose, Calif.

[73] Assignee: Synopsys, Inc., Mountain View, Calif.

[ * ] Notice: This patent is subject to a terminal disclaimer.

[21] Appl. No.: 08/468,034

[22] Filed: Jun. 6, 1995

Related U.S. Application Data

[63] Continuation-in-part of application No. 08/335,592, Nov. 8, 1994, Pat. No. 5,828,580.

[51] Int. Cl.$^6$ ..................................................... G06F 15/00
[52] U.S. Cl. .......................... 364/489; 364/488; 364/490; 364/491
[58] Field of Search .................................... 364/489, 490, 364/488, 491, 578, 484, 481; 395/311, 312, 700, 500

[56] References Cited

U.S. PATENT DOCUMENTS

| | | | |
|---|---|---|---|
| 4,837,447 | 6/1989 | Pierce et al. ............................. | 364/490 |
| 5,031,111 | 7/1991 | Chao et al. ............................. | 364/491 |
| 5,043,920 | 8/1991 | Malm et al. ............................. | 364/488 |
| 5,051,938 | 9/1991 | Hyduke .................................... | 364/578 |
| 5,202,841 | 4/1993 | Tani ........................................ | 364/491 |

(List continued on next page.)

OTHER PUBLICATIONS

Wang, Z. and Qiming Wu, IEEE Transactions on Computer–Aided Design, vol. 11, No. 4, Apr. 1992, "A Two–Dimensional Resistance Simulator Using the Boundary Element Method", pp. 497–504.

Fukuda, Sanae et al., IEEE Transactions on Computer–Aided Design, vol. 9, No. 1, Jan. 1990, "A ULSI 2–D Capacitance Simulator for Complex Structures Based on Actual Processes", pp. 39–47.

McCormick, Steven P., 21st Design Automation Conference, Paper 39.2, "EXCL: A Ciruit Extractor for IC Designs", pp. 616–623 (1984).

Stark, Don and Mark Horowitz, 24th ACM/IEEE Design Automation Conference, Paper 32.2, "REDS: Resistance Extraction for Digital Simulation", pp. 570–573 (1987).

Horowitz, Mark and Robert W. Dutton, IEEE Transactions on Computer–Aided Design, vol. CAD–2, No. 3, Jul. 1983, "Resistance Extraction from Mask Layout Data", pp. 145–150.

Hwang, Jerry P., 28th ACM/IEEE Design Automation Conference, Paper 41.1, "REX—A VLSI Parasitic Extraction Tool for Electromigration and Signal Analysis", pp. 717–722 (1991).

*Primary Examiner*—Jacques H. Louis-Jacques
*Attorney, Agent, or Firm*—Townsend and Townsend and Crew LLP

[57] ABSTRACT

A method of extracting layout parasitics for nets of an integrated circuit. The method creates a connectivity-based database (1104), where geometries of a layout are organized by nets of the circuit schematic. The method permits net-by-net extraction (1124) of layout parasitics using a connectivity-based database. A user can select a net or nets for extraction. A net is decomposed into polygon subsections, and parasitics are determined for these subsections. Layout parasitics for some of the decomposed geometries may be found in a predefined geometry library. A database is created containing nets and their extracted layout parasitics (1132). A netlist format file may be generated from this database of extracted parasitics to provide for back annotation of layout parasitics into a circuit schematic for further circuit analysis.

14 Claims, 29 Drawing Sheets

Microfiche Appendix Included
(1 Microfiche, 1 Pages)

U.S. PATENT DOCUMENTS

| | | | |
|---|---|---|---|
| 5,210,701 | 5/1993 | Hana et al. | 364/488 |
| 5,218,551 | 6/1993 | Agraval et al. | 364/491 |
| 5,231,590 | 7/1993 | Kumar et al. | 364/491 |
| 5,247,456 | 9/1993 | Ohe et al. | 364/491 |
| 5,278,105 | 1/1994 | Eden et al. | 364/488 |
| 5,278,769 | 1/1994 | Bair et al. | 364/490 |
| 5,303,161 | 4/1994 | Burns et al. | 364/490 |
| 5,305,229 | 4/1994 | Dhar | 364/489 |
| 5,351,197 | 9/1994 | Upton et al. | 364/490 |
| 5,367,468 | 11/1994 | Fukasawa et al. | 364/490 |
| 5,381,345 | 1/1995 | Takegami et al. | 364/489 |
| 5,392,222 | 2/1995 | Noble | 364/490 |
| 5,402,357 | 3/1995 | Schaefer et al. | 364/490 |
| 5,402,358 | 3/1995 | Smith et al. | 364/490 |
| 5,416,717 | 5/1995 | Miyama et al. | 364/488 |
| 5,440,720 | 8/1995 | Baisuck et al. | 364/489 |
| 5,452,224 | 9/1995 | Smith, Jr. et al. | 364/488 |
| 5,459,673 | 10/1995 | Carmean et al. | 364/489 |
| 5,461,579 | 10/1995 | Misheloff et al. | 364/491 |
| 5,463,563 | 10/1995 | Bair et al. | 364/490 |
| 5,490,095 | 2/1996 | Shimada et al. | 364/578 |

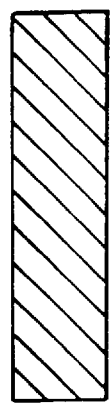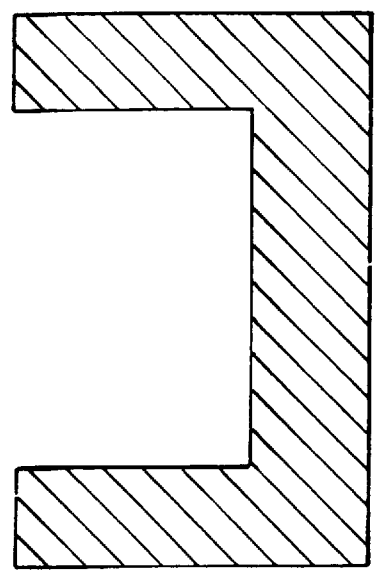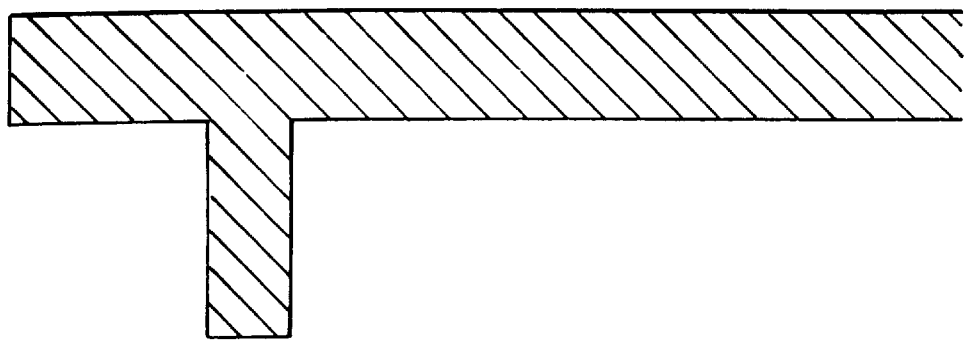
FIG. 6.

System Commands

```
*System;; System block
  DBUnit = 0.001 Um;; DDB length unit, unit is case in
           default is microns = Um RESolution = 0.05 Um;; DDB digitization grid unit
              default is microns = Um CAP-Mode = 3; capacitor simulation model number
             3 = parallel-plate, empirical 2D model
             valid numbers range from 1 to 39
             1-19 = empirical model; 20-39 = field
             solver model CAP-Unit = ff; pf = picofarads, or ff = femtofarads
             case insensitive, default is ff RES-UNIT  = mohm; ohm or mohm = milliohm
              case insensitive, default is mohm PROBe-text = TEST1; probe text file name, case sensi-
               tive;probe text file name is case sensitive PROcess = process_name; process name stored in model
            header process_name is case sensitive SUMmary = sum_filename; extraction report summary
            filename; sum_filename is case sensitive CAP_ENVIRONMENT = PHYA CPLYB ALA ALB; case insensitive
       interconnect layers for capacitance simulation
       environment layers should be same for MODELING
       and RCEXTRACT steps EXTract-net-file = netfile2;
            selected nets input filename is case sensitive INPUT-DRACULA  =../LPEdata; DRACULA database directory OUTPUT-SPICE = Spice; SPICE output file name
  OUTPUT-GDS2  = output,.GDS2 out_TopCell; GDSII output
        filenames.
  OUTPUT-TIMEMILL = TimeMill; TimeMill output file name
  OUTPUT-POWERMILL = PowerMill; PowerMill output file
           name above output file names are case sensitive
```

*FIG. 18.*

Library Commands
```
*Library;; Library block
```

This section contains the file names to be used for
storing the geometry model library information
generated by the MODELING command.

```
save-R-model=New_R_Mod; New R geometry model library
    file
save-C-model=New_C_Mod; New C geometry model library
    file
R-model=Old_R_Mod; Old R geometry model library file
C-model=Old_C_Mod; Old R geometry model library file
    above output file names are case sensitive
```

*FIG. 19.*

Display Commands
```
*Display;; Display block
```

All layer names in this section must agree exactly with
the internal Dracula database (DDB) layer names.

All layer numbers in this section must agree exactly
with the internal Dracula database (DDB) layer numbers.

All Dracula database (DDB) layer names limited to 8
characters. First DDB layer name character must be
one of a to z, or A to Z. DDB layer name characters 2
to 8 may be a-z,A-Z, or a number from 0 to 9.
DDB layer name examples: POLY, pdiff, ALA, M1, MET12345

```
ALA  = 3; metal 1
ALB  = 4; metal 2

POLY = 25; poly
plya = 23;
cplyb = 24;

CONT = 12; contact
thol = 15; contact hole

NDIFF = 31; n diffusion
PDIFF = 32; p diffusion
```

*FIG. 20.*

Technology Commands

```
*Technology;; Technology block
   All layer names in this section must agree exactly with
   the internal Dracula database (DDB) layer names.

Interconnection ALA:; Interconnection ALB:;
   thickness= 0.8;;
   oxide-thickness = 1.2
   oxide-permitivity = 3.2;; relative permitivity
   sheet-resistance = 0.001 ohm;;
   cap=environment-range = 5; um Interconnection PLYA:; Interconnection CPLYB:;
   thickness= 0.45;;
   oxide-thickness = 1.2
   oxide-permitivity = 3.2;; relative permitivity
   sheet-resistance = 0.001 ohm;;
   cap-environment-range = 5; um Contact hole; Contact cont; Contact pbcon; Contact thol;
   resistance = 0.001 ohm;
   capacitance = 0.5 ff substrate sub; semiconductor substrate
   sheet-resistance = 2.1 ohm;
   capacitance = 0.9 ff mos p
   device = pgate;
   drain  = pdiff   sheet-res = 3.0
   source = pdiff   sheet-resistance = 3.0
   gate   = plya  oxide-thick = 0.45 oxide-per = 3.2 mos n
   device = ngate;
   drain  = ndiff   sheet-res = 4.0
   source = ndiff   sheet-resistance = 4.0
   gate   = plya  oxide-thick = 0.45 oxide-per = 3.2
```

*FIG. 21.*

Connectivity Commands
*CONNECTIVITY

The connect-layer-sequence specifies the sequence of
    semiconductor interconnect layers from bottom to top.

connect-layer-sequence = **ndiff  pdiff  plya  cplyb  ala
                              alb**

The connect statement defines how layera is connected
    to layerb by way of contact type:
    Example: connect layera layerb by contact-type connect ala      alb     by   hole
    connect ala      plya    by   cont
    connect plya     cplyb   by   thol
    connect ala      ndiff   by   cont
    connect ala      pdiff   by   cont
    connect plya     ndiff   by   pbcon
    connect cplyb    ndiff   by   thol

*FIG. 22.*

METHOD OF EXTRACTING LAYOUT PARASITICS FOR NETS OF AN INTEGRATED CIRCUIT USING A CONNECTIVITY-BASED APPROACH

This application is a continuation-in-part of U.S. patent Ser. No. 08/335,592 filed on Nov. 8, 1994, now U.S. Pat. No. 5,828,580.

COPYRIGHT NOTICE

A portion of the disclosure of this patent document contains material which is subject to copyright protection. The copyright owner has no objection to the xerographic reproduction by anyone of the patent document or the patent disclosure in exactly the form it appears in the Patent and Trademark Office patent file or records, but otherwise reserves all copyright rights whatsoever.

APPENDIX

Microfiche Appendix A comprising one sheet is included in this application.

BACKGROUND OF THE INVENTION

The present invention relates to the field of designing and fabricating integrated circuits. More specifically, the present invention relates to a system for extracting layout parasitics.

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer designs the integrated circuit by creating a circuit schematic indicating the electrical components and their interconnections. Generally, designs are simulated by computer to verify functionality and ensure performance goals are satisfied.

Integrated circuits are typically fabricated using a photolithography technique where a semiconductor material is selectively exposed to light by using masks. The exposed (or unexposed) areas of the semiconductor material are processed to form the features of the integrated circuit such as transistors and interconnects. Processing continues layer by layer until all the layers of the integrated circuit are formed.

Each mask contains the geometries for a particular layer of the integrated circuit. For example, a geometry may be used to form the metal interconnection between two transistors. To generate the masks for an integrated circuit, the circuit designer first creates a layout of the electrical components that implements the design in a circuit schematic. This layout is generally contained in a computer database having all the geometries for all mask layers. From this computer database, the masks are generated.

The layout of an integrated circuit contains parasitic resistances and capacitances from the interconnections and devices. The values of these parasitics depend on the process parameters, shape and dimensions of a particular geometry, and relationship of a particular geometry to other geometries. These parasitics affect the performance and possibly the functionality of an integrated circuit. Consequently, during the design phase of an integrated circuit, these parasitics are extracted from a layout and taken into consideration during circuit simulation. Two conventional approaches for extracting layout parasitics are the full-chip Boolean operation method and direct simulation method.

The Full-Chip Boolean Operation Method

The full-chip Boolean operation method extracts full-chip layout parasitics. A user must specify the Boolean operations that are to be performed on the layout layers. The user must also provide a table of process parameters and coefficient values. In order to specify these Boolean operations, the user undertake the sometimes intricate task of writing custom equations for each design. As integrated circuits continue to increase in size, functionality, and complexity, so does the time and effort required to develop the correct Boolean operation.

The approach of using Boolean operations to calculate resistance and capacitance parasitic data was developed over fifteen years ago. The simple formulas generated by this approach were previously sufficient. However, as feature sizes of VLSI chips approach 0.3 micron and smaller, this approach cannot reliably extract layout parasitics information accurately enough to meet the performance requirements for interconnect simulations and timing analysis of present-day high-performance VLSI designs.

This full-chip Boolean operation method is typically performed as a batch extraction and uses the command file to extract parasitic capacitances for the entire integrated circuit. Consequently, this becomes very time consuming because the approach computes parasitic resistance and capacitance value for geometries in total isolation.

A user who desires only to extract data on a particular net, such as a clock net, must extract an entire integrated circuit to get the desired information. After this information is obtained and analysis is performed on the net, the user will want to make changes if the targeted performance goal is not achieved. After any changes are made, a user will need to extract the entire design once again to perform the required analysis. These design iterations can take weeks to complete. Even if this method is successfully used, the user cannot generate a complete distributed resistance and capacitance (RC) netlist (which provides greater accuracy) suitable for timing or interconnect simulation.

The above approach also uses textual data to pass information to and from the extraction process, which is not a format directly compatible with many software programs. Another disadvantage of the full-chip Boolean net is that a user cannot select a net for extraction. Furthermore, there is no graphical interface or viewer that permits a user to view the design or highlight and select a net or block for extraction of the parasitic data. A user must extract the entire design each time a change is made to the layout or extraction is required on any part of the chip.

The Direct Simulation Method

The direct simulation method has been implemented to extract small-area layout parasitics. It is based on a user specifying a particular area or region of an integrated circuit for extraction. This area is then divided into smaller areas which a field solver can simulate. However, a drawback is that the field solver takes a substantial amount of time to simulate even for relatively small areas. Consequently, this approach is limited to small-area parasitic extraction. Although some improvements have been made in the art of field solvers, extraction time is still excessive. Furthermore, a field solver approach cannot generate a complete net-by-net distributed RC netlist including transistor parameter timing or power simulation.

The direct simulation method is also not net-based. The direct simulation method performs calculations only select areas, regions, geometries, or structures to extract, but not a net. A net, such as a clock net, may extend throughout an integrated circuit; it would not be practical for a field solver to consider such a large area.

As the feature sizes of integrated circuits are shrinking, operating frequencies of integrated circuits are increasing, and the number of transistors per integrated circuit is increasing, performance of integrated circuits depend more on layout parasitics, especially the layout parasitics of interconnect. Furthermore, since the number and complexity of integrated circuits continues to increase, there is a need for better, faster, more accurate, and improved layout parasitics extraction methods.

SUMMARY OF THE INVENTION

A layout parasitic extraction system is disclosed. The system may be coupled with layout network connectivity extraction (NCE) or layout versus schematic checker (LVS) to allow net-by-net layout parasitic extraction under user input without again requiring whole chip connectivity extraction.

The system takes user specified information to automatically create an extraction routine for the particular design. The system can display the design to allow for interactive extraction at the net, block, or integrated circuit level. The system uses the layout net or net number to extract selected net parasitics in conjunction with a file of transistors to create a complete netlist for timing simulation.

The present invention uses a lookup library of predefined geometries to minimize extraction time and adds any new geometries discovered during extraction to the lookup library. The system calls the parasitic simulator directly to calculate the value and updates the library. After the simulator calculates the required values, the system provides a netlist to other simulators for further analysis and simulation.

Other objects, features, and advantages of the present invention will become apparent upon consideration of the following detailed description and the accompanying drawings, in which like reference designations represent like features throughout the figures.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee.

FIG. 6 is a diagram of a metal-1 layer of the layout of the circuit schematic;

FIG. 18 is a system commands functional block of a sample technology file;

FIG. 19 is a library commands functional block of a sample technology file;

FIG. 20 is a display commands functional block of a sample technology file;

FIG. 21 is a technology commands functional block of a sample technology file;

FIG. 22 is a connectivity commands functional block of sample technology file;

DESCRIPTION OF THE SPECIFIC EMBODIMENTS

Figure 1:
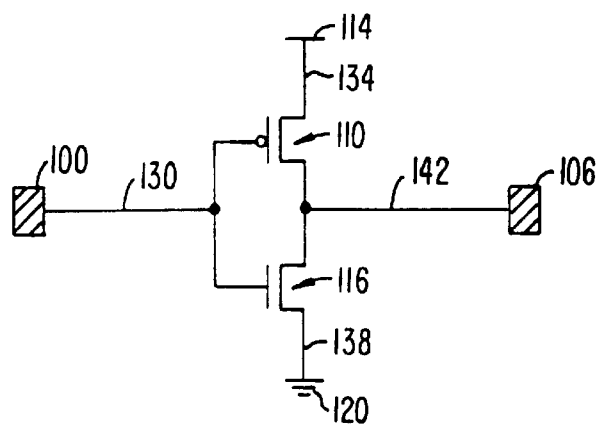
FIG. 1 is a diagram of an example of a circuit schematic.

FIG. 1 is an example of a circuit schematic containing a circuit design. A circuit design is an circuit, often containing electronic or electrical components, that is designed to a provide desired functionality. A circuit design may contain many circuit schematics. Some examples of circuit designs include microprocessors, memories, programmable logic devices (PLDs), application specific integrated circuits (ASICs), operational amplifiers, differential amplifiers, power supply regulators, registers, logic gates, printed circuit boards, tuners, and the like.

The schematic of FIG. 1 shows a CMOS inverter. This circuit performs the logical function of an inverter or NOT gate. The inverter has an input pad 100 and an output pad 106. A PMOS transistor 110 is coupled between a VDD source 114 and output pad 106. An NMOS transistor 116 is coupled between output pad 106 and a VSS source 120. Input pad 100 is coupled to a gate of PMOS transistor 110 and a gate of NMOS transistor 116.

The circuit schematic contains circuit elements and nets. Circuit elements are basic elements used to design and create circuits. Circuit elements include transistors, resistors, capacitors, voltage sources, current sources, input pads, output pads, logic gates, registers, counters, and many others. In FIG. 1, input pad 100, output pad 106, PMOS transistor 110, VDD source 114, NMOS transistor 116, and VSS source 120 are circuit elements.

Nets are the connections between the circuit elements. Sometimes nets are referred to as the nodes of the circuit. For example, in FIG. 1, a net 130 connects input pad 100 to the gate of PMOS transistor 110 and the gate of NMOS transistor 116. A net 134 connects PMOS transistor 110 to VDD source 114. A net 138 connects NMOS transistor 116 to VSS source 120. And, a net 142 connects output pad 106 to PMOS transistor 110 and NMOS transistor 116.

Figure 2:
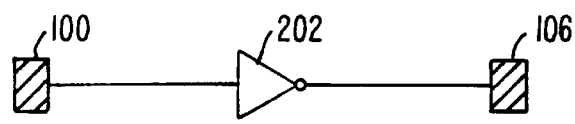
FIG. 2 is a diagram of a symbolic embodiment of the circuit schematic of FIG. 1.

FIG. 2 is another circuit schematic representation of the inverter in FIG. 1. FIG. 2 shows a standard logic symbol representation for an inverter 202. Inverter 202 is coupled between input pad 100 and output pad 106. The circuit schematic of FIG. 2 is functionally equivalent to the circuit schematic of FIG. 1. Circuit elements PMOS transistor 110, NMOS transistor 116, VDD source 114, and VSS source 120, are not shown, but are represented by inverter 202. FIG. 2 also contains nets. One net connects input pad 100 to an input of inverter 202, while another net connects output pad 106 to an output of inverter 202.

Symbols such as inverter 202 are used to simplify circuit schematic drawings, thus making designs more manageable and easier to understand. This is desirable especially when creating complex circuit schematics, containing many circuit elements and many nets. Others symbols include, for example, AND gates, OR gates, NAND gates, and NOR gates, which are well known by those in the art.

Typical electrical designs may contain many circuit elements and nets. For example, in a design, inverter 202 is a logical building block that may be combined with other inverters 202, transistors, logic gates, inputs, outputs, resistors, capacitors, voltage sources, to create a particular functionality.

Figure 3:
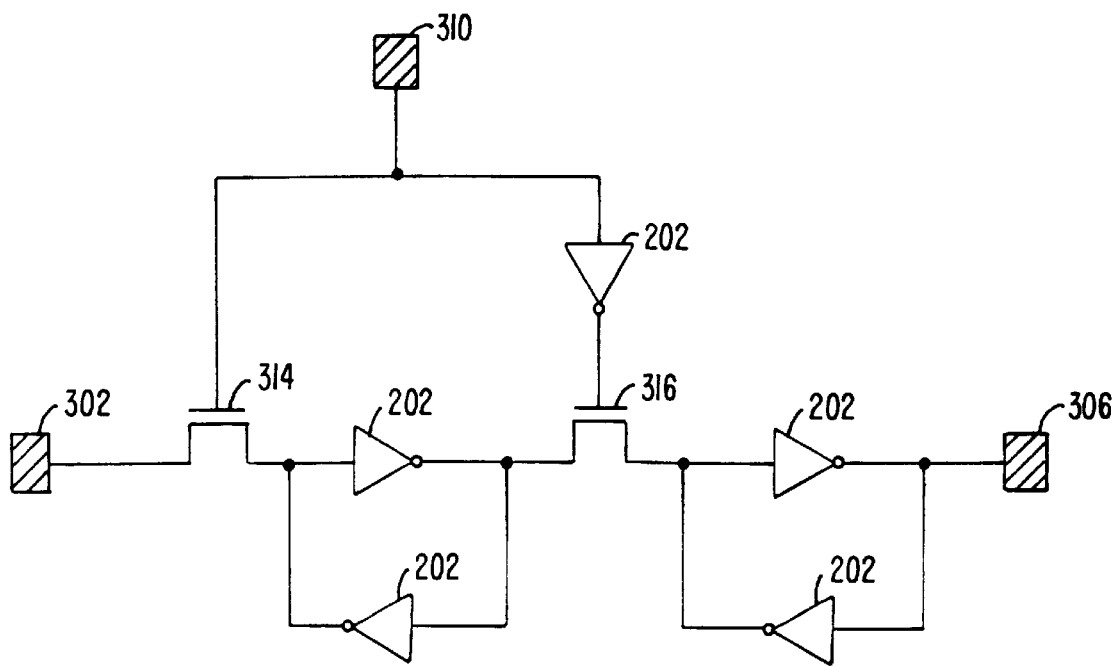
FIG. 3 is a diagram of an example of a more complex circuit schematic.

An example of a more complex design is shown in FIG. 3, comprising many circuit elements and nets. FIG. 3 is a circuit schematic of a negative-edge-triggered D-flip-flop. This design includes numerous inverters 202 of FIG. 2. The D-flip-flop has an input pad 302, output pad 306 and clock pad 310. An NMOS pass transistor 314 is coupled between input pad 301 and an inverter 202. Clock pad 310 is coupled to a gate of NMOS pass transistor 314. An NMOS pass transistor 316 is coupled between inverter 202 and another inverter 202, which is coupled to output pad 306. Clock pad 310 is coupled, through an inverter 202, to a gate of NMOS pass transistor 316. An inverter 202 feedbacks from output pad 306 to an output of pass transistor 316. An inverter 202 feedbacks from an input to NMOS pass transistor 316 to and output of NMOS pass transistor 314. The connections between the circuit elements described above are nets for this design.

Figure 4:
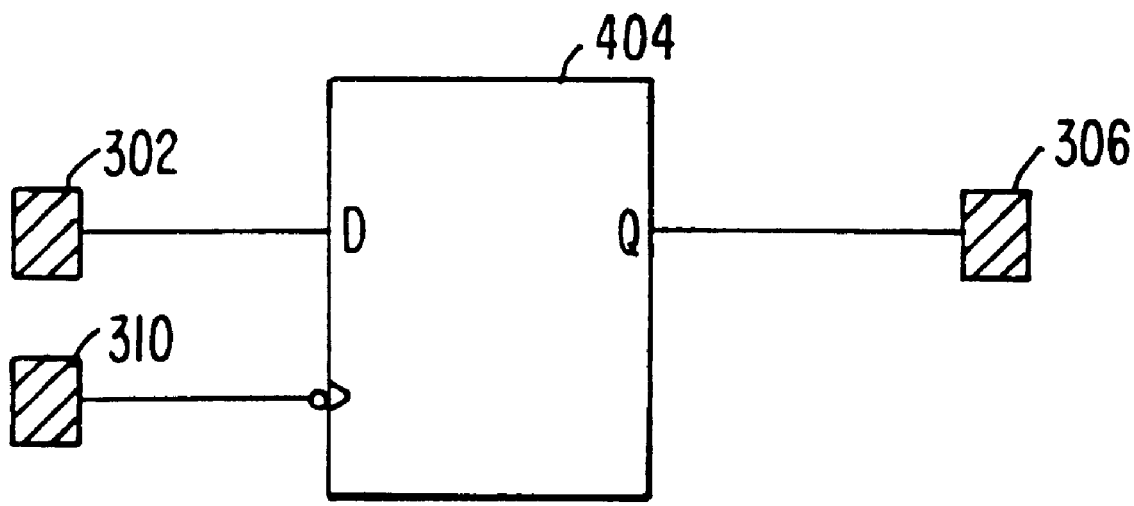
FIG. 4 is a diagram of a symbolic embodiment of the circuit schematic of FIG. 3.

A symbolic representation of the D-flip-flop of FIG. 3 is shown in FIG. 4. The circuit schematic of FIG. 4 is functionally equivalent to the circuit schematic of FIG. 3. D-flip-flop symbol 404 represents the circuitry in FIG. 3. Input pad 302 is coupled to a D input of D-flip-flop 404. Output pad 306 is coupled to a Q output of D-flip-flop 404. And, clock pad 310 is coupled to a clock input of D-flip-flop 404. D-flip-flop 404 may be coupled with other circuit elements to create more complex design schematics.

Figure 5:
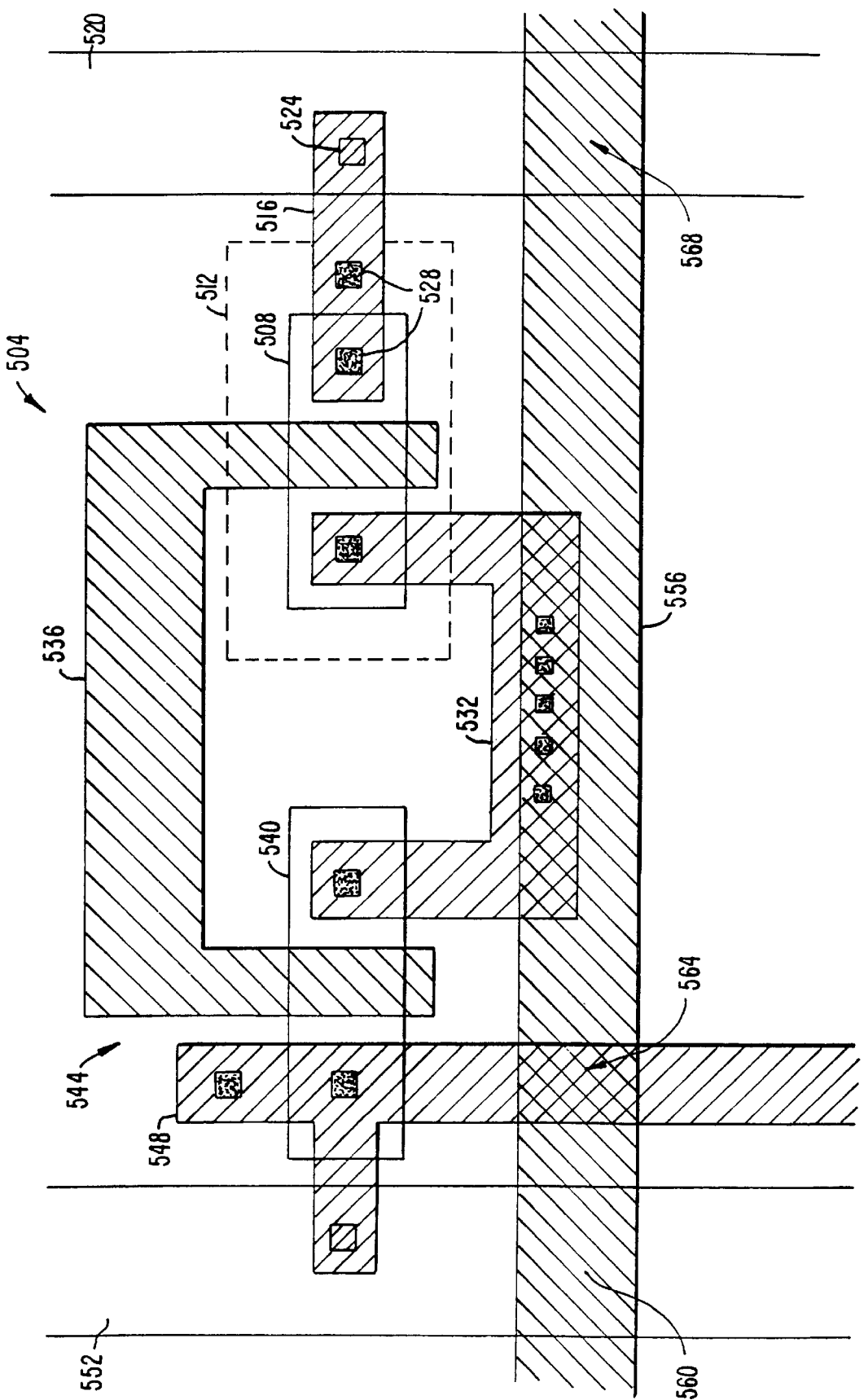
FIG. 5 is a diagram of a layout of the circuit schematics of FIGS. 1 and 2.

FIG. 5 shows an example of a layout 504 of the inverter in circuit schematics of FIGS. 1 and 2. A layout is a physical representation of the circuit, as it will be fabricated in an integrated circuit. Integrated circuits may be manufactured in various process technologies including silicon semiconductor, gallium arsenide semiconductor, and silicon over sapphire semiconductor. As shown in FIG. 5, layout 504 is for a CMOS technology silicon semiconductor process. Many details of semiconductor layout and processing are not necessary for an understanding of the present invention and such details are not described below, but would be known to those skilled in the art.

Layout 504 contains a plurality of polygons or geometries, representing the various semiconductor materials used to create the circuit elements and nets (connections) of FIGS. 1 and 2. The representations of different processing materials are shown in various shading and fill patterns. Moreover, layout 504 may represent only a portion of the integrated circuit. Typically, a integrated circuit includes many layouts similar to layout 504.

PMOS transistor 110 is formed by a p-diffusion region 508 in an n-well tub 512. One terminal of PMOS transistor 110 is coupled through a metal-1 conductor 516 to a metal-2 conductor 520. Metal-2 conductor 510 is coupled to a VDD source at another location on the integrated circuit. Metal-1 conductor 516 is coupled through a via 524 to metal-2 conductor 520. Metal-1 conductor 516 is also coupled to p-diffusion region 508 by a contact 528. Metal-1 conductor 516 is coupled to n-well tub 516 through another contact 528. Another terminal of PMOS transistor 110 is coupled through metal-1 conductor 532 to a layout of NMOS transistor 116. A gate of PMOS transistor 110 is formed using polysilicon region 536. Polysilicon 536 is also an input of the inverter in the layout. Metal-1 conductor 532 is an output of the inverter.

NMOS transistor 116 is formed by an n-diffusion region 540 on substrate 544. One terminal of NMOS transistor 116 is coupled through a metal-1 conductor 548 (through a contact and a via) to metal-2 conductor 552. Metal-2 conductor 552 is coupled to a VSS source at another location on the integrated circuit. Metal-1 conductor 548 also couples, through a contact, the VSS source to substrate 544. Another terminal of NMOS transistor 116 is coupled through metal-1 conductor 532 to PMOS transistor 110. Metal-1 conductor 532 is also coupled, through contacts, to polysilicon conductor 556. Polysilicon conductor 556 is also an output of the inverter.

Layout 504 contains layout parasitics that are a result of the physical properties and characteristics of the semiconductor processing material, as well as interactions between different semiconductor materials. These parasitics include parasitic resistances, parasitic capacitances, and other similar parameters. For example, polysilicon may have a resistance of about twenty-five ohms per square. As a consequence, there will be an amount of parasitic resistance depending on the distance (and width of the polysilicon conductor) between connections.

Generally, a parasitic capacitance is formed when one semiconductor processing material crosses, overlaps, or overlays another semiconductor processing material. A parasitic capacitance is also formed when semiconductor materials carrying different signals are in close proximity to another. Parasitic capacitances often result from crisscrossing conductors used to conduct different logic signals. Parasitic capacitances are not usually desirable because they can degrade circuit performance.

A parasitic capacitor can store charge in the area formed by the overlapping materials. The shape of a parasitic capacitor may be any polygon shape, depending on how materials overlap. The shape is often square or rectangular. The amount of parasitic capacitance (size of a parasitic capacitor) depends on the semiconductor processing. In particular, the nature of the dielectric material between two material and the thickness of the dielectric material between the two materials are important factors.

For example, when a polysilicon conductor crosses (or physically overlaps) a metal-1 conductor, metal-2 conductor, or other semiconductor material, there will a parasitic capacitance formed between the materials. In FIG. 5, polysilicon conductor 556 has three parasitic capacitors. In particular, polysilicon conductor 556 crosses metal-2 conductor 552, forming a parasitic capacitance 560. Polysilicon conductor 556 also crosses metal-1 conductor 548, forming a parasitic capacitance 564. And, polysilicon 556 crosses metal-2 conductor 520, forming a parasitic capacitance 568. Parasitic capacitors 560, 564, and 568 are rectangularly shaped parasitic capacitors.

Polysilicon conductor 556 overlays metal-1 conductor 532, but this overlay does not form a parasitic capacitor. Capacitances result from dissimilar charges applied to the plates of the capacitor. Since polysilicon conductor 556 and metal-1 conductor 532 are connected by contacts, they carry the same signal (or charge) and do not produce a parasitic capacitance.

As discussed earlier, the amount of parasitic capacitance depends on the semiconductor processing. Typically, for the same given area, a parasitic capacitance between polysilicon and metal-1 is greater than a parasitic capacitance between polysilicon and metal-2. This is due to a greater dielectric distance (oxide thickness) between polysilicon and metal-2 than polysilicon and metal-1.

Also, although two semiconductor materials may not be shown overlapping in FIG. 5, these materials may nevertheless overlap in the finished product due to the materials becoming overlapped as a result of the semiconductor processing. These overlaps will create parasitic capacitance. Also, the area of the parasitic capacitance created by overlapping areas may be larger than that shown in the layout resulting from the semiconductor processing.

Furthermore, the nets of the layout can be contained on many different materials, and can extend across an entire integrated circuit. For example, a signal may be conducted on metal-1 for a distance, then polysilicon for another distance, and then finally in metal-1 again. Parasitic resistances and capacitances along the path of the net contribute to the total parasitics for the entire net. The parasitics for the entire net will be determined by the layout parasitics extraction system of the present invention.

Layout parasitics can be determined by extracting them from the geometries (or polygons) in the layout. These layout parasitics are important in determining the behavior and performance of electrical circuits, especially transient response. The more accurately layout parasitics are determined, the more accurately circuit behavior and performance can be predicted.

Figure 7:
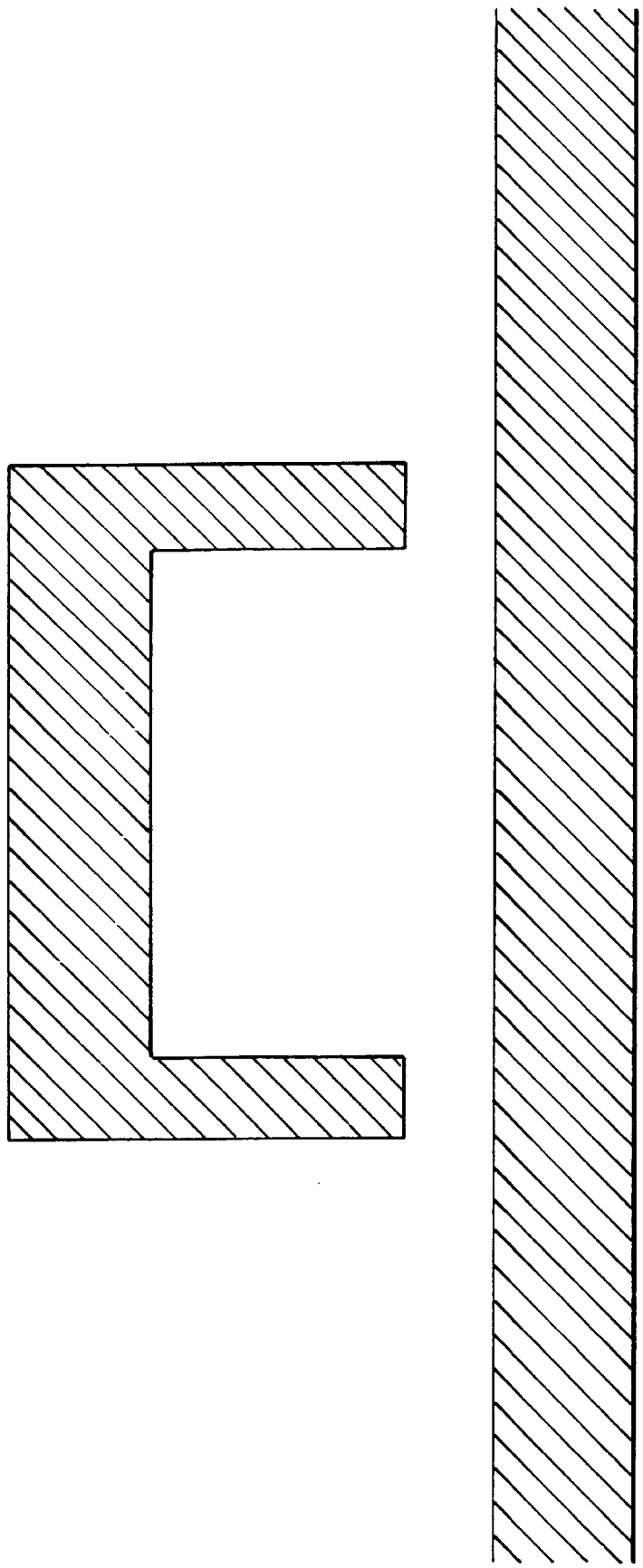
FIG. 7 is a diagram of a polysilicon layer of the layout of the circuit schematic.

FIG. 6 is a diagram of the metal-1 conductor layer of the layout of FIG. 5. FIG. 7 is a diagram of the polysilicon layer of the layout of FIG. 5. FIG. 6 and FIG. 7 more clearly show how layout is comprised of various layers, representing the various semiconductor materials. Moreover, the other semiconductor materials in FIG. 5 also have a respective layer. These layers are combined to create the semiconductor structures on a semiconductor wafer.

In particular, the various layers of the layout, containing polygons and geometries, are used to create a set of semiconductor processing masks. These semiconductor process masks are used in a step-by-step photolithography process to create a semiconductor integrated circuit. The resulting circuit elements, transistors, geometries, and other similar structures on the integrated circuit perform the same function as the circuit in the circuit schematic on which the layout may be based. Therefore, a circuit schematic represents information about circuit elements and nets. A layout polygons and geometries which represent the circuit elements and nets as they will be processed on a semiconductor integrated circuit.

Figure 8:
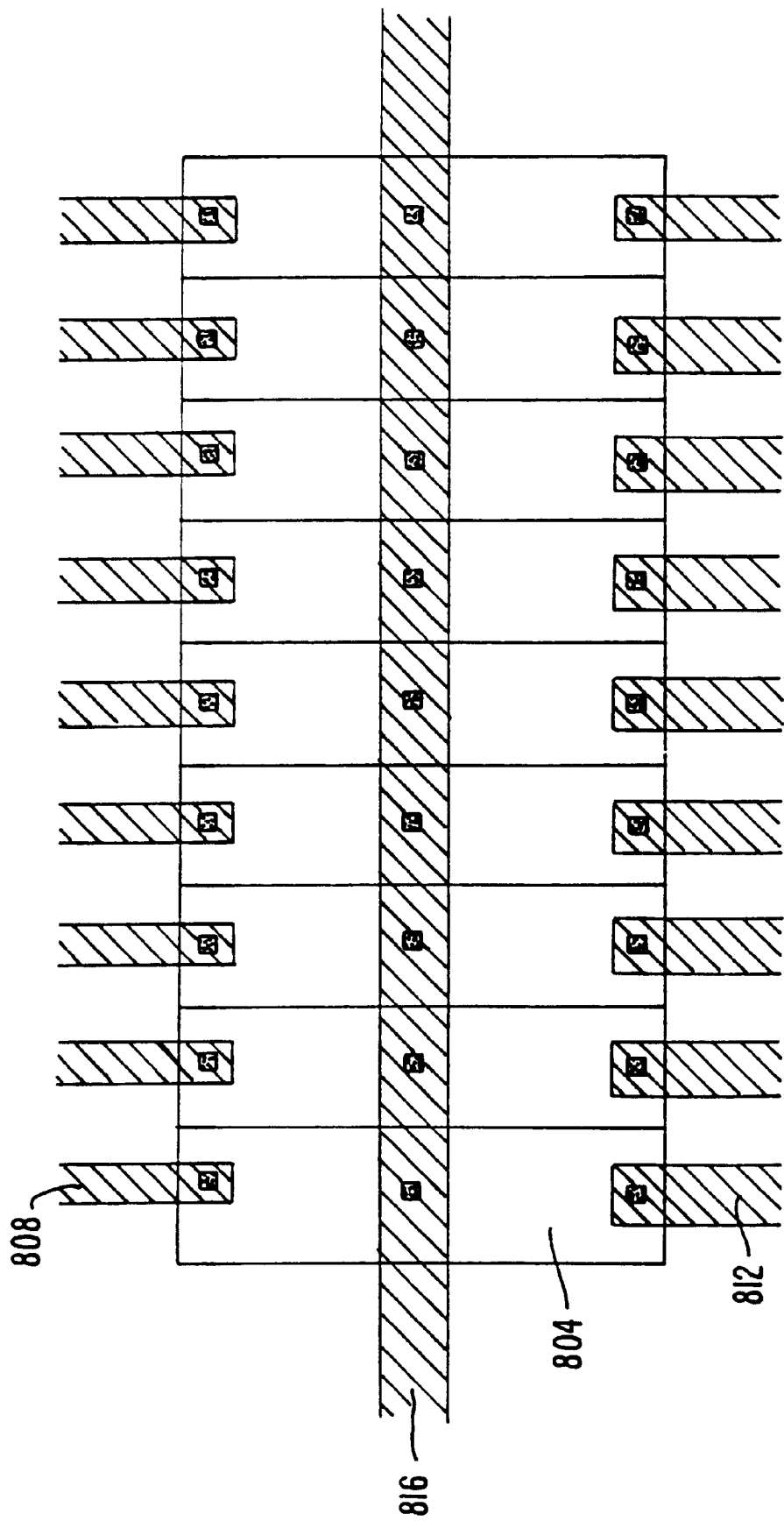
FIG. 8 is a diagram of a layout of the circuit schematics of FIGS. 3 and 4.

FIG. 8 is a layout of a plurality of D-flip-flops of FIG. 3 and FIG. 4. Box 804 contains a layout of one D-flip-flop of FIG. 3 and FIG. 4. The details of the layout of the D-flip-flop are not shown to simplify the diagram. In FIG. 8, there are nine D-flip-flops. Each D-flip-flop has an input 808 using a metal-1 conductor and output 812, also using a metal-1 conductor. A global clock line 816 on metal-1 is coupled to the clock input of the D-flip-flops. FIG. 8 shows an example of how a plurality of D-flip-flops of FIGS. 3 and 4 may be laid-out.

Layout parasitics within box 804 may be extracted in a similar fashion to that described above for FIG. 5. In FIG. 8, all boxes 804 would have similar layout parasitics. However, metal-1 lines 808 and 812 may have different layout parasitics. Metal-1 lines 808, 812, and 816 may be routed to different locations, varying in length, as well as path. For example, a particular metal-1 line 812 may have more jogs, reversals, corners, angles, and other similar differences from another metal-1 line 812. An extraction of the layout parasitics these nets would show these differences.

Furthermore, global clock line 816 would most likely be routed to many different circuits, structures, and geometries on an integrated circuit. Hence, global clock line 816 will likely have distributed layout parasitics—layout parasitics distributed along its path. For example, there may be a resistance and capacitance component between the connections of various components and circuit elements. Distributed layout parasitics should also be taken into consideration for more accurate simulation results. Therefore, the layout parasitics must be extracted to take account of distributed layout parasitics. A further discussion of distributed layout parasitics is given below.

Figure 9:
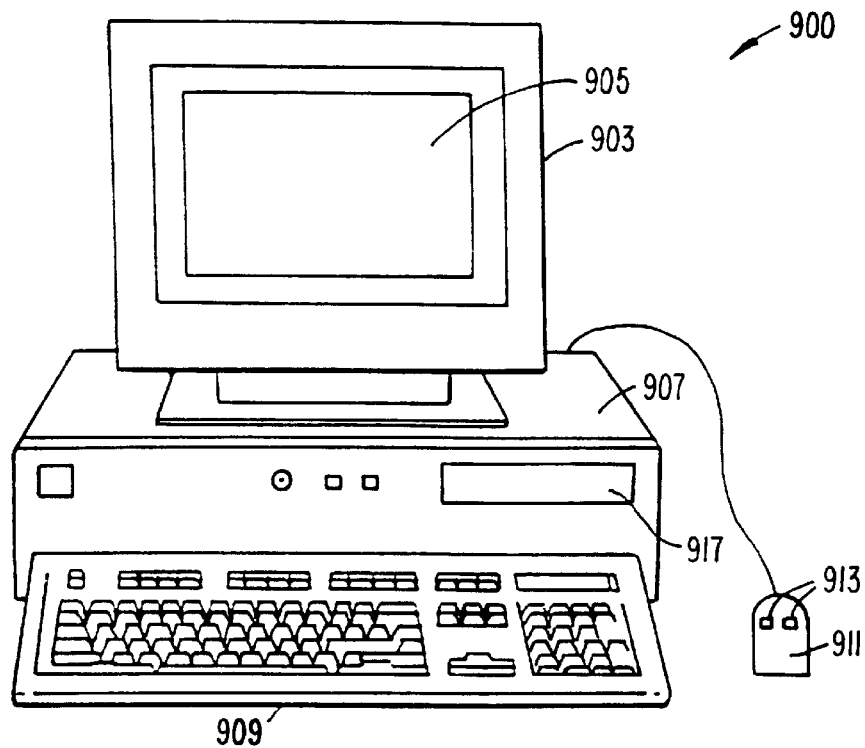
FIG. 9 illustrates an example of a electronic system used on which the layout parasitics extraction system of the present invention may be embodied.

FIG. 9 illustrates an example of a layout extraction system of the present invention. More specifically, FIG. 9 may comprise a computer system used to execute the software of the present invention. FIG. 9 shows a computer system 900 which includes a monitor 903, screen 905, cabinet 907, keyboard 909, and mouse 911. Mouse 911 may have one or more buttons such as mouse buttons 913. Cabinet 907 houses familiar computer components (not shown) such as a processor, memory, mass storage devices 917, and the like. Mass storage devices 917 may include mass disk drives, floppy disks, magnetic disk, fixed disk, hard disk, CD-ROM, CD-WORM, tape storage, and other similar media, and combinations of these. A binary, machine-executable version, of the software of the present invention may be stored or reside on mass storage devices 917. Furthermore, the source code of the software of the present invention may also be stored or reside on mass storage devices 917.

Figure 10:
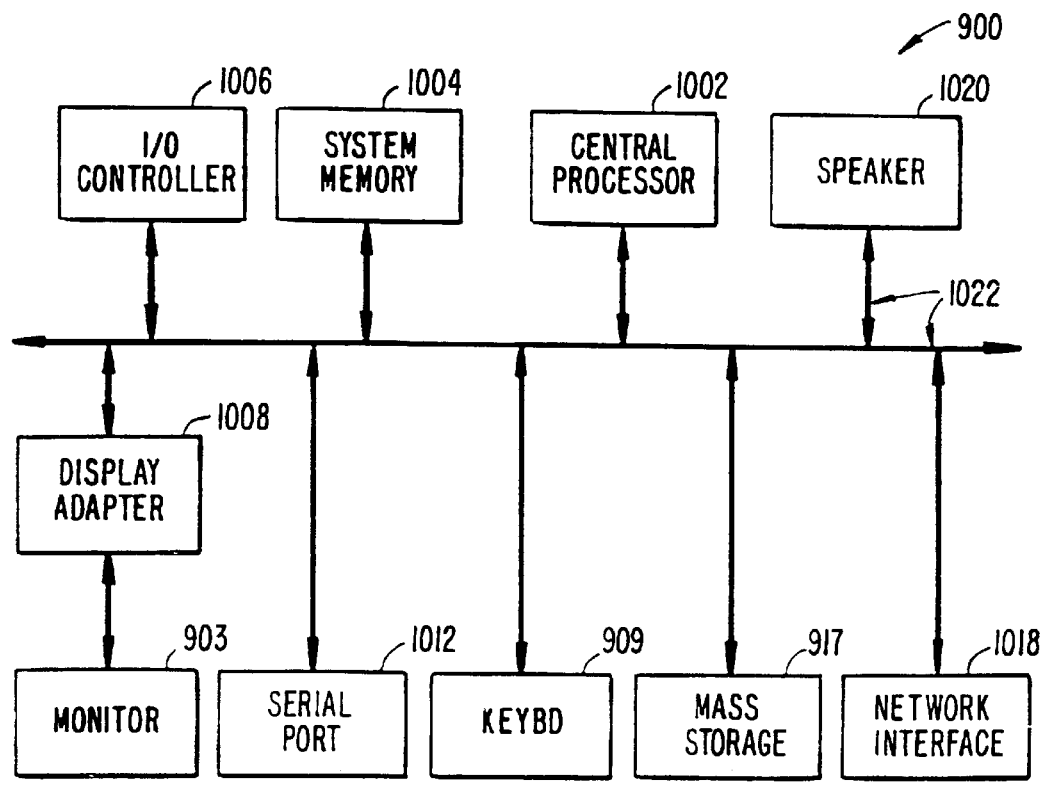
FIG. 10 shows a system block diagram of a typical electronic system on which the present invention may be embodied.

FIG. 10 shows a system block diagram of computer system 900 used to execute the software of the present invention. As in FIG. 9, computer system 900 includes monitor 903, keyboard 909, and mass storage devices 917. Computer system 900 further includes subsystems such as central processor 1002, system memory 1004, I/O controller 1006, display adapter 1008, serial port 1012, network interface 1018, and speaker 1020. Other computer systems suitable for use with the present invention may include additional or fewer subsystems. For example, another computer system could include more than one processor 1002 (i.e., a multiprocessor system) or a system may include a cache memory.

Arrows such as 1022 represent the system bus architecture of computer system 900. However, these arrows are illustrative of any interconnection scheme serving to link the subsystems. For example, speaker 1020 could be connected to the other subsystems through a port or have an internal direct connection to central processor 1002. Computer system 900 shown in FIG. 10 is but an example of a computer system suitable for use with the present invention. Other configurations of subsystems suitable for use with the present invention will be readily apparent to one of ordinary skill in the art.

Furthermore, circuit schematics of a circuit design may be input and stored on a system such as shown in FIGS. 9 and 10. More specifically, the circuit schematics may be stored in a circuit schematic database. This circuit schematic database contains the circuit elements and nets of the circuit schematic. For example, in a circuit schematic database, the circuit elements are assigned unique circuit element numbers, and are related by nets, which are assigned arbitrary net numbers.

A layout of a circuit design may also be input and stored on a system such as shown in FIGS. 9 and 10. More specifically, the layout may be stored in a layout database. This layout database contains the geometries and polygons of the layout. For example, geometries of a layout may be represented by their coordinates and relationship to an origin. Furthermore, the layout database may also include information on a layer number of the geometry (which represents a particular semiconductor processing layer).

Figure 11:
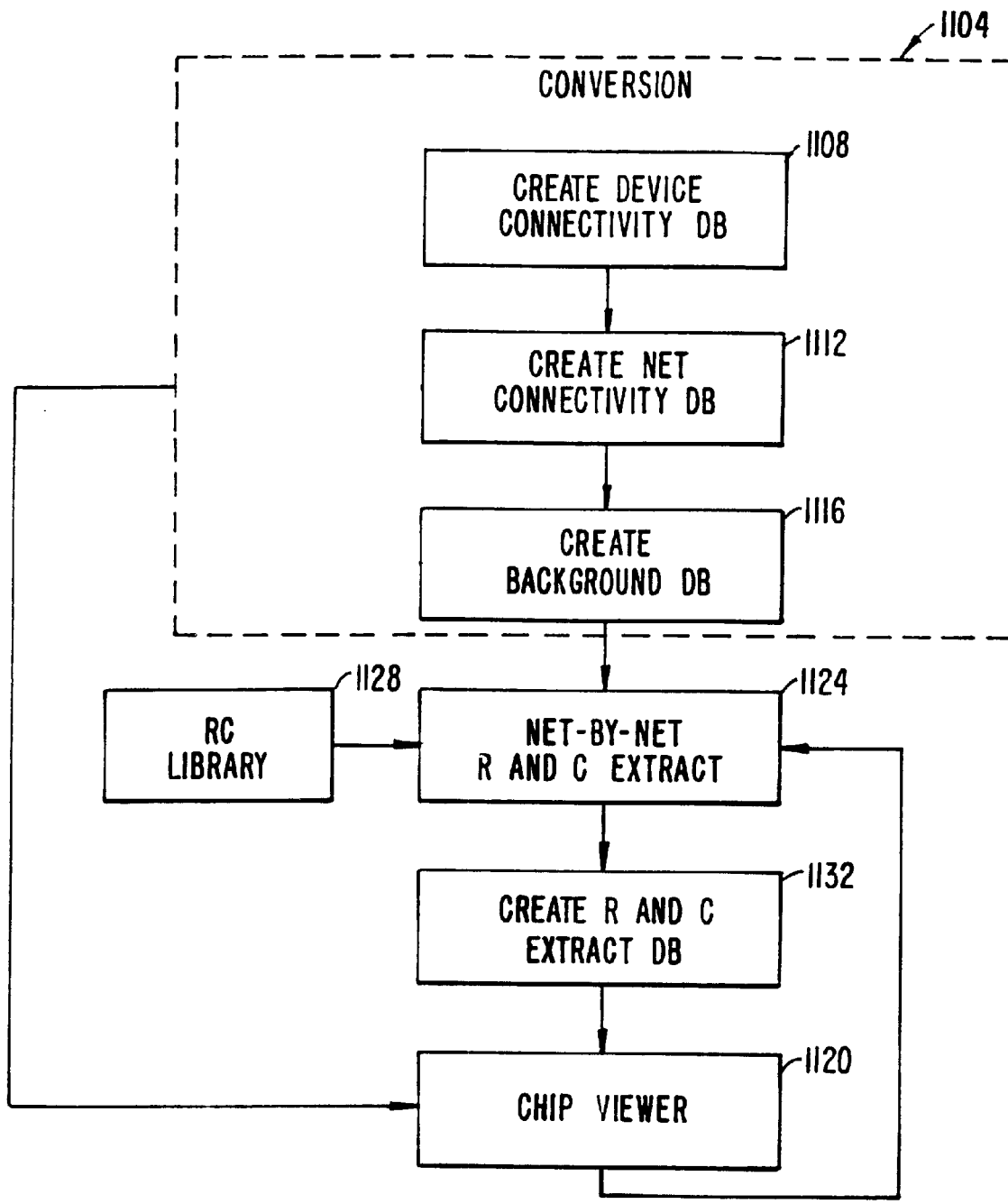
FIG. 11 is a flow diagram of the overall layout parasitics extraction system of the present invention.

FIG. 11 is an overall flow diagram of the layout parasitics extraction method of the present invention. The flow in FIG. 11 may be performed on a general-purpose computer, such as the system shown in FIGS. 9 and 10, or computing machine specially adapted for layout parasitics extraction. For example, the ARCADIA™ source code in C++ language in Appendix A is an implemention of an embodiment of the present invention for a general-purpose computer.

In the design of an integrated circuit, a user creates a circuit schematic and a layout for an integrated circuit. The circuit schematic is contained on a circuit schematic database, while the layout is a layout database. The circuit schematic database may be in a netlist format, which contains circuit elements interrelated by net. The layout database contains the geometries, polygons, layers, and other features of the layout of the integrated circuit. A common layout database format is GDSII.

A first step in the layout parasitics extraction method of the present invention is conversion 1104. Conversion 1104 generates a connectivity-based database where geometries of the layout are referenced and interrelated by the nets and circuit elements of the circuit schematic. More specifically, geometries are referenced to their corresponding nets and circuit elements in the circuit schematic.

In one embodiment of the invention, conversion 1104 starts with a layout-versus-schematic (LVS) database. A LVS database is a database resulting from a layout-versus-schematic check. During an LVS check, a layout is checked for consistency with a corresponding circuit schematic. The LVS check process forms circuit elements and nets from the layout. The LVS check process creates an LVS database where these circuit elements and nets from the layout are organized by the geometries of the layout. For example, referring to FIG. 5, an LVS database may contain a net comprised of polysilicon conductor 556. This net would be referenced by the layout coordinates of polysilicon conductor 556. In other embodiments of the present invention, a database such as an LVS-type database may be created directly, without going through an LVS process.

Using the schematic database and LVS database, conversion 1104 generates a connectivity-based database of geometries of the layout. The connectivity-based database contains circuit elements and nets of the circuit schematic, which are organized and referenced by geometries of the layout. More specifically, in one embodiment, the connectivity-based database contains nets (specified by net name or net number) of the circuit schematic, which are referenced to and organized by geometries (specified by coordinates) of layout.

Furthermore, the connectivity-based database may be contained in more than one database file. For example, in the embodiment shown in FIG. 11, conversion 1104 creates a device connectivity database 1108, a net connectivity database 1112, and a background database 1116. The device connectivity database 1108 is a database of devices of the integrated circuit organized by net. The net connectivity database 1112 is a database of nets of the integrated circuit organized by connections. The background database 1116 is a database of environment information regarding structures (such as overlaps and spacing of the geometries) of the integrated circuit. These three databases collectively comprise a connectivity-based database of the present invention.

After conversion 1104, a user may use chip viewer 1120 to view the layout or circuit schematic of the integrated circuit on a graphics display. Chip viewer 1120 uses the device conductivity database generated in conversion 1104. Chip viewer 1120 may provide an interactive graphics display of nets, trees, and blocks of design in a connectivity-based database. For example, a user can select layers of the layout, nets, and circuit elements to view. Chip viewer 1120 also automatically selects complex clock trees, global clock signals distributed to many circuits. Moreover, chip viewer 1120 provides full zoom and pan capabilities. A user can also select a net of the circuit schematic and view extracted resistance and capacitance values for that net. For example, with chip viewer 1120, a user can select a net or nets graphically for extraction by net-by-net R and C extract 1124. A user may also select a net by entering a schematic net name and layout net number, or schematic block name.

After conversion 1104, instead of using chip viewer 1120, a user may proceed to net-by-net R and C extract 1124. Using the connectivity-based database generated during conversion 1104, net-by-net R and C extract 1124 extracts the parasitic resistances (R) and parasitic capacitances (C) of the layout. Net-by-net R and C extract 1124 extracts the parasitics in a net-by-net fashion. More example, net-by-net R and C extract 1124 extracts parasitics for a net, then proceeds to another net, and so forth until the desired nets are extracted.

Net-by-net R and C extract 1124 allows extraction at various levels, including net, cell, block, and entire integrated circuit levels. For example, a user may extract selected nets—nets selected using chip viewer 1120. Furthermore, when extracting at a level comprising repeated cells (e.g., block and entire integrated circuit levels), net-by-net R and C extract 1124 will use parasitics data previously determined so that each block will only be extracted once. For example, for FIG. 8, net-by-net R and C extract 1124 will only extract layout parasitics for one box 804, and use these extracted values for the other boxes 804, since boxes 804 contain the same layout.

In addition to a connectivity-based database, net-by-net R and C extract 1124 also utilizes an RC library 1128, which comprises files, definitions, and libraries including information on the process technology and parasitics for predefined structures. For example, RC library 1128 includes information on polysilicon resistance, n-well resistance, metal-1 resistance, polysilicon-to-metal-1 capacitance, overlap capacitance, oxide thickness, and other similar parameters.

Create R and C extract database 1132 creates an R and C extract database of the parasitic resistance and capacitance values extracted during net-by-net R and C extract 1124. Chip viewer 1120 also allows viewing of data in the R and C extract database 1132. For example, a user can view the extracted resistance and capacitance values graphically.

Furthermore, other software, including software from third parties, may use the R and C extract database 1132 to provide other data pertinent for the design and fabrication of integrated circuits. In one embodiment, the R and C extract database 1132 may be back annotated into the circuit schematic to allow circuit simulation with extracted parasitics. Other examples include clock skew analysis, power net analysis, electromigration analysis, characterization of cells, coupling effects between digital and analog sections of mixed signal integrated circuits, critical path analysis, timing analysis, and multiple signal race condition analysis.

Figure 12:
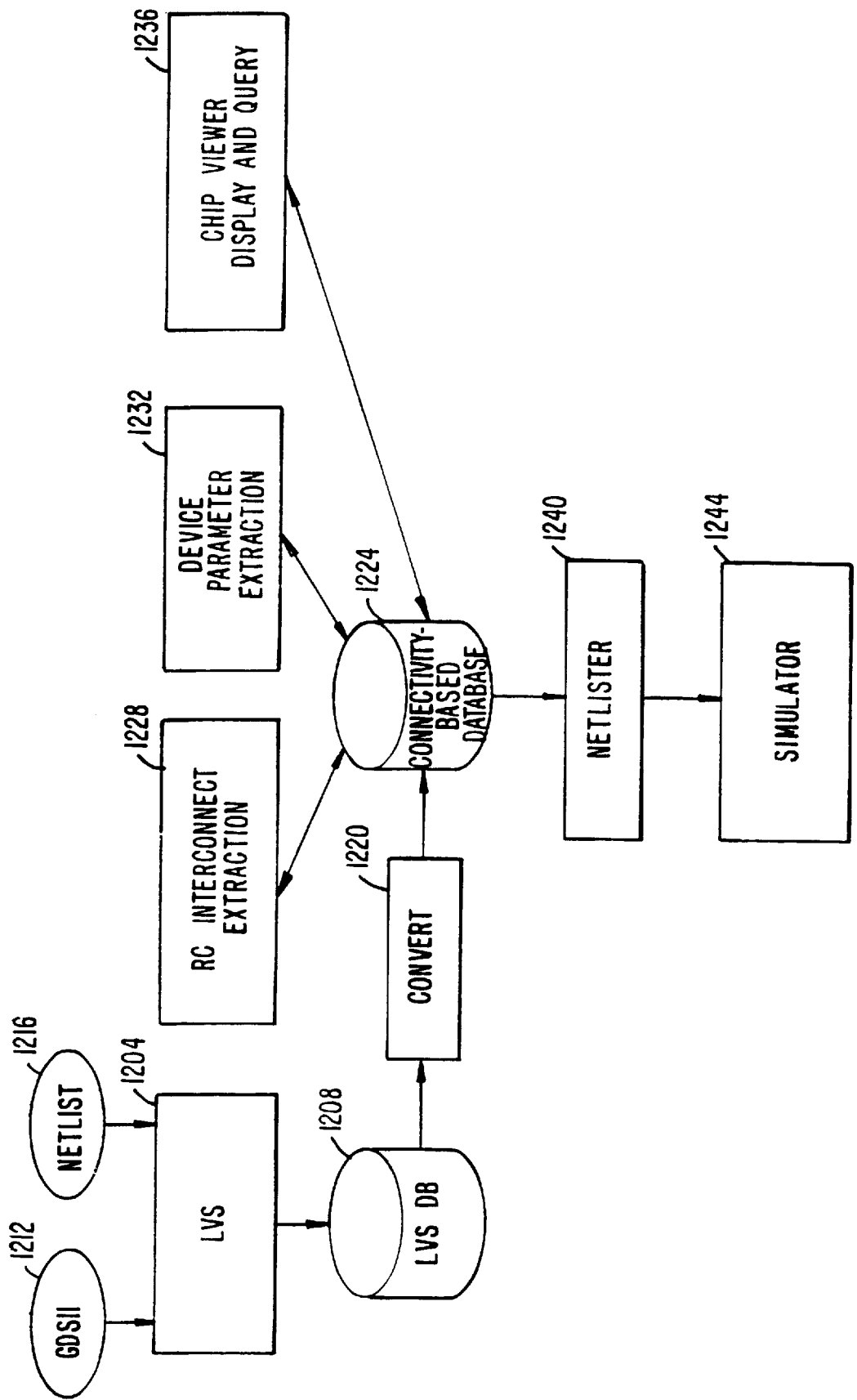
FIG. 12 is a flow diagram of another embodiment of the overall layout parasitics extraction system of the present invention.

FIG. 12 is an overall flow diagram of an architecture of the parasitics extraction system of the present invention. In this embodiment, LVS process 1204 generates an LVS database 1208 from layout in a GDSII file 1212 and circuit schematics in a netlist file 1216. Convert 1220 converts the LVS database 1208, where nets of an integrated circuit are organized by geometries of the layout, into a connectivity-based database 1224, where nets from geometries of the layout are organized by nets of the circuit schematic. Using connectivity-based database 1224, RC interconnect extraction 1228 extracts layout parasitics for selected nets or an entire integrated circuit. Further, RC interconnect extraction 1228 creates an R and C extract database containing the extracted parameters. Also, using connectivity-based database 1224, device parameter extraction 1232 will extract device parameters such as, among others, width, length, area of source, area of drain, perimeter of source, perimeter of drain, net resistance of drain, and net resistance of source.

Chip viewer 1236 is used to display and query the connectivity-based database 1224 and is similar to chip viewer 1120 of FIG. 11. A user may use chip viewer 1236 to view the layout or circuit schematic of the integrated circuit on a graphics display. In one embodiment, chip viewer 1236 provides an interactive graphics display of nets, trees, and blocks in the connectivity-based database. The user can view selected layers, net paths, signal paths, and blocks. Chip viewer 1236 also automatically selects complex clock trees. Moreover, chip viewer 1236 provides full zoom and pan capabilities. A user can also view extracted resistance and capacitance values. Furthermore, with chip viewer 1236, a user can graphically select a net or nets for extraction by RC interconnect extraction 1228. The user may also select a net by entering a schematic net name and layout net number, or schematic block name.

From connectivity-based database 1224, netlister 1240 will generate a netlist-format file of the extracted parasitic resistance and capacitance values. In this format, the extracted parasitic values may be back annotated into the circuit schematic for simulation and analysis of the circuit by a simulator 1244. Also, other applications software may use the netlist format file to produce other integrated circuit analyses including clock skew analysis, power distribution analysis, timing analysis, electromigration analysis, coupling analysis, power ground bounce analysis, and inductance analysis.

Figure 13:
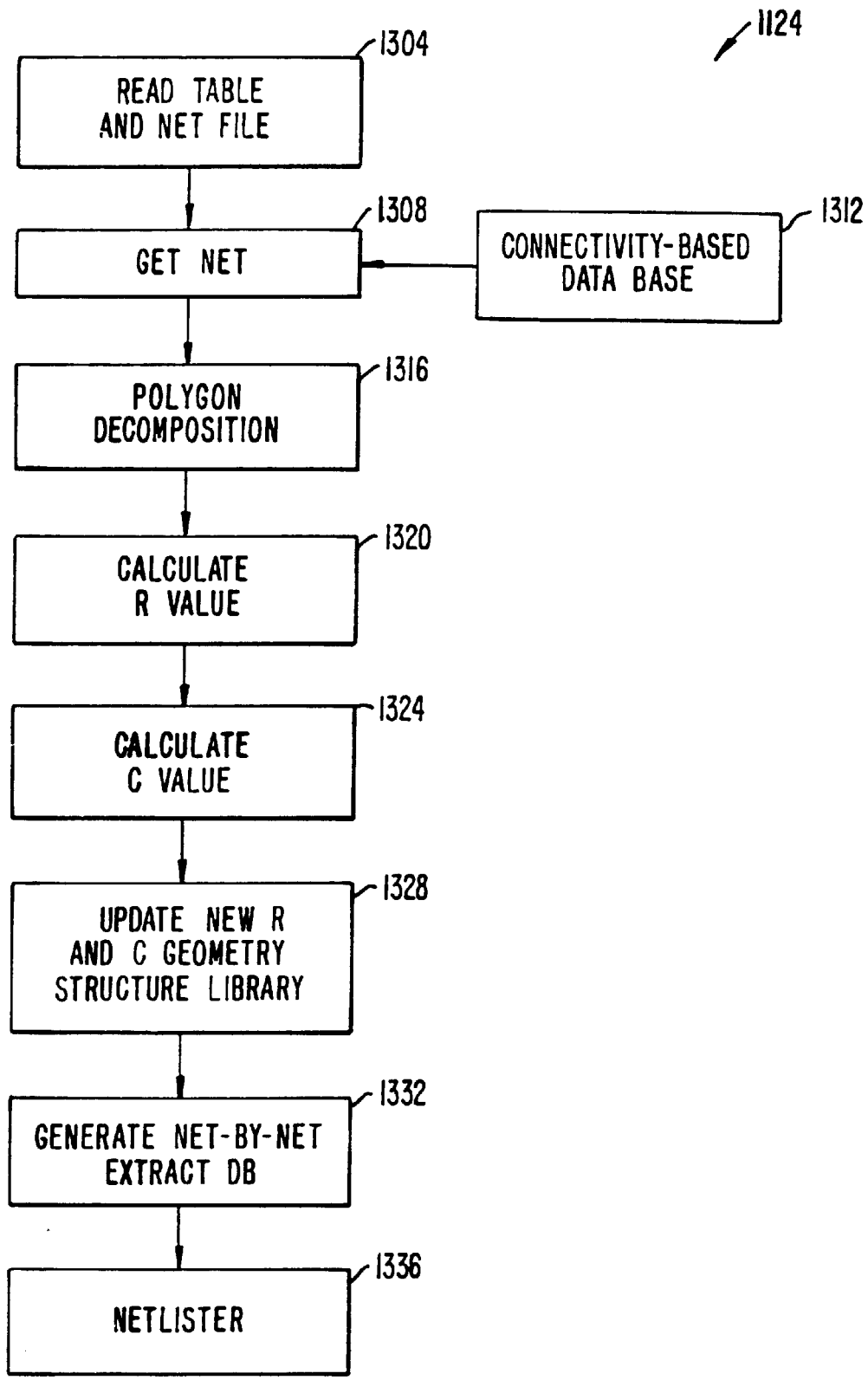
FIG. 13 is a flow diagram of the net-by-net resistance and capacitance extraction method of the present invention.

FIG. 13 is a more detailed flow diagram of the net-by-net R and C extract 1124 step of FIG. 11. Read table and net file 1304 reads information about the integrated circuit process, predefined structures, and previously extracted structures. This information can be retrieved from RC library 1128.

After read table and net file 1304, the next step is get net 1308, which gets the structures connected to a net or selected net. A user may have previously selected this net (possibly by using chip viewer 1120 of FIG. 11 as described above). Get net 1308 uses a connectivity-based database 1312 that was created in steps 1108 and 1112 of FIG. 11 (e.g., comprising device and net conductivity databases). Get net 1308 "traces" through a net in connectivity-based database 1312, finding and preparing layout geometries for parasitics extractions.

After a particular net and its related structures are designated for extraction, the next step is polygon decomposition 1316 where a particular geometry, polygon, or structure is broken (or divided) into smaller, easier-to-extract pieces. For example, a long rectangular polygon is broken down into a plurality of smaller squares or rectangular structures. The locations where a polygon is broken up are referred to as breakpoints. In later steps of the flow in FIG. 13, the resistance and capacitance values are extracted and calculated for these smaller polygons. These differential segments are than added to determine the layout parasitics (resistance or capacitance) for the structure.

In order to properly account for equipotential lines of current, special decomposition techniques must be used to break up irregularly shaped polygons. Irregularly shaped polygons are generally those that are not square or rectangular. For example, an L-shaped turn, corner, or junction in a polysilicon line would form an irregularly shaped polygon. In an embodiment of the present invention, for irregularly shaped polygons, polygon decomposition 1316 selects breakpoints a distance W/2 (where W is the width of the polygon) in opposite directions from the irregular polygon. In the end, the decomposed polygon includes the irregular polygon and two W/2 portions. For example, for an L-shaped turn, the decomposed polygon would include the L-shaped turn, a first portion W/2 from the turn, and a second portion W/2 from the turn. When extracted, this decomposed polygon will properly account for equipotential lines of current. This method of polygon decomposition also properly accounts for equipotential lines of current for other types of junctions having a plurality of branches, such as T-junctions.

In another embodiment of the present invention, Polygon decomposition 1316 decomposes nets and structures into smaller sections or pieces to allow for distributed RC modeling of the layout parasitics. In practice, long nets do not have a simple parasitic resistance and parasitic capacitance component, but rather resistances and capacitances distributed along the length of the net. In order to accurately model distributed RC, nets must be broken up into smaller sections and extracted individually. Generally, the smaller the decomposed sections, the greater the accuracy of the distributed RC model. The distributed RC modeling of the present invention allows for more accurate modeling of layout parasitics. Distributed RC modeling of the present invention is discussed further below.

After polygon decomposition 1316, the next step is calculate R value 1320 which determines the parasitic resistance value of the selected structure or net. Calculate R value 1320 either finds a parasitic resistance value in a lookup table of previously extracted structures or calculates a value. Parasitic resistance determination is discussed further below. Calculate C value 1324 determines the parasitic capacitances of the selected structure or net. Calculate C value 1324 either finds a parasitic capacitance value in a lookup table of previously extracted structures or calculates a value. Parasitic capacitance determination is discussed further below. In other embodiments of the present invention, calculate C value 1324 may precede calculate R value 1320.

Update new R and C geometry structure library 1328 updates the lookup tables of previously extracted parasitic resistances and capacitances with new structures not already in these lookup tables. For example, a lookup table for parasitic resistances is contained in a R geometry structure library. And a lookup table for parasitic capacitances is contained in a C geometry structure library. With each iteration through net-by-net R and C extract 1124, new structures are learned and added to the lookup tables. In subsequent iterations, structures that match those in the lookup tables will not need to be calculated; instead, values from the lookup tables will be used. Since calculation of parasitics values takes more computing time than searching and selecting a value from a lookup table, this feature of the present invention speeds execution of the routine.

Generate net-by-net extract database 1332 generates a connectivity-based database (referred to as the net-by-net extract database) containing the extracted parasitics. The extracted parasitics parameters are organized by nets of the circuit schematic. Netlister 1336 (similar to netlister 1240 of FIG. 12) uses this net-by-net extract database to back annotate the parasitics extracted back into the circuit schematic database to allow circuit simulation of the integrated circuit with the extracted parasitics. Furthermore, using the net-by-net extract database, netlister 1336 can generate a netlist format file that can be used by software (possibly from a third-party) to provide other types of integrated circuit analyses such as clock skew analysis, power net analysis, electromigration analysis, characterization of cells, coupling effects between digital and analog sections of mixed signal integrated circuits, critical path analysis, timing analysis, and multiple signal race conditions analysis.

Figure 14:
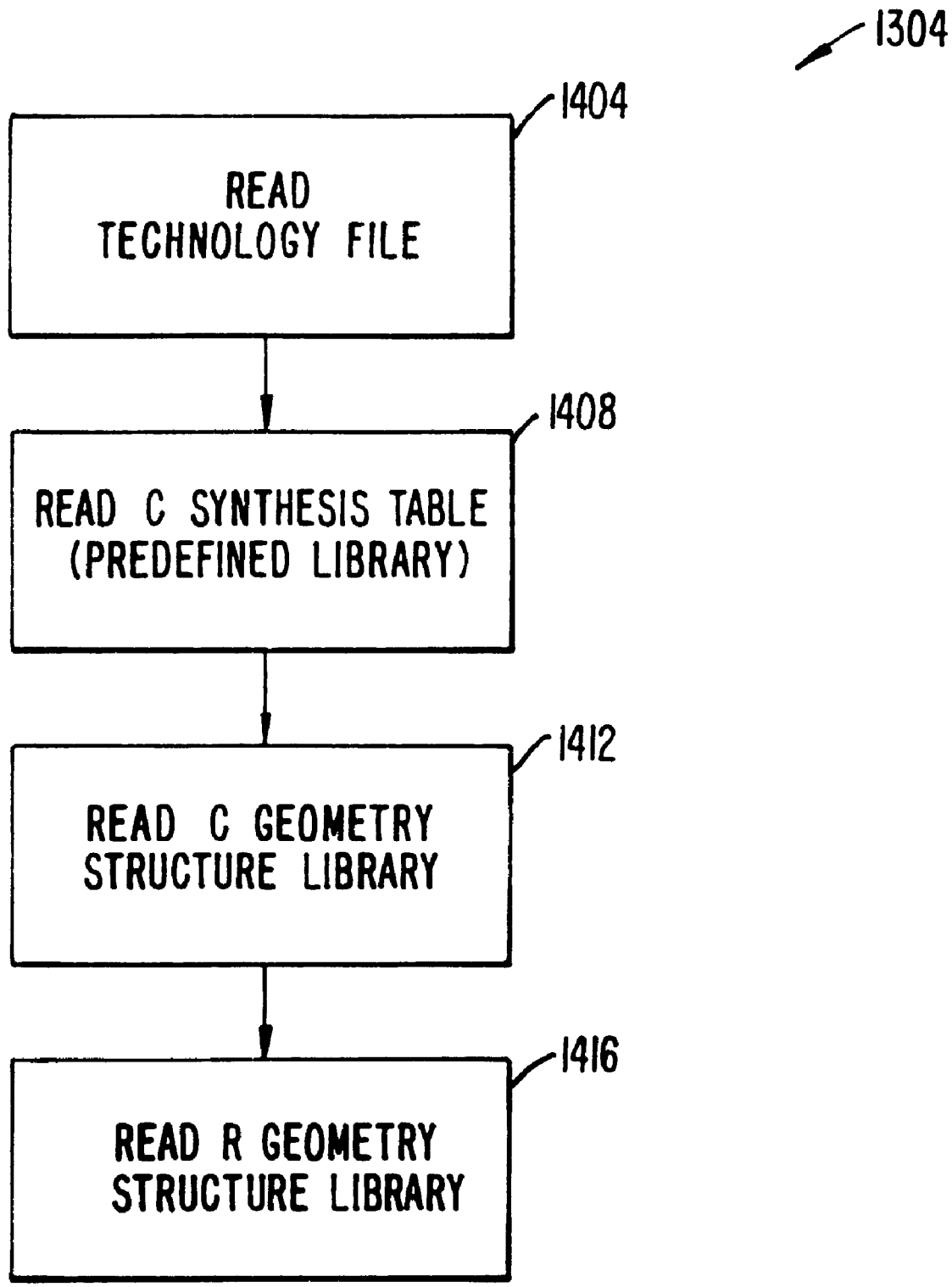
FIG. 14 is a flow diagram of the read table and net file method of the present invention.

FIG. 14 shows a more detailed flow diagram of read table and net file 1304 of FIG. 13. Read technology file 1404 reads a process technology file containing information about the parameters of the particular process used to fabricate the integrated circuit. For example, for an interconnection or conductor layer, a user may specify the thickness of that layer, sheet resistance, and capacitance environment range. As a further example, for a MOS transistor, a user may specify the sheet resistance of the p-diffusion and the oxide thickness of the gate. The layout extraction system of the present invention uses the parameters in the process technology file to calculate the layout parasitics. For example, if the layout extraction system finds 5 squares in a polysilicon line and determined from the process technology file that polysilicon has 25 ohms per square, then there will be 125 ohms of resistance.

Read C synthesis table 1408 is reads a C synthesis table, which contains predefined structures where capacitance values have already been calculated. The C synthesis library is a lookup table, which is consulted before calculating the capacitance of a particular structure. If the structure is found in the C synthesis table, then the parasitic capacitance value found in the table will be used, rather than calculating a value. As discussed earlier, this speeds up execution of the layout extraction system of the present invention.

Read C geometry structure library 1412 reads a C geometry structure library, which is a lookup table containing previously extracted capacitance values. The C geometry structure library is similar to the C synthesis table because both are lookup tables which are consulted before calculating a parasitic capacitance value. However, newly calculated parasitic capacitance structures are added to the C geometry structure library.

Read R geometry structure library 1416 reads an R geometry structure library, which is a lookup table containing previously extracted parasitic resistance values. R geometry structure library is similar to the C geometry structure library, but contains parasitic resistance values instead. The R geometry library is consulted before calculating a parasitic resistance value. Furthermore, newly calculated parasitic resistance values structures are added to the R geometry structure library.

Figure 15:
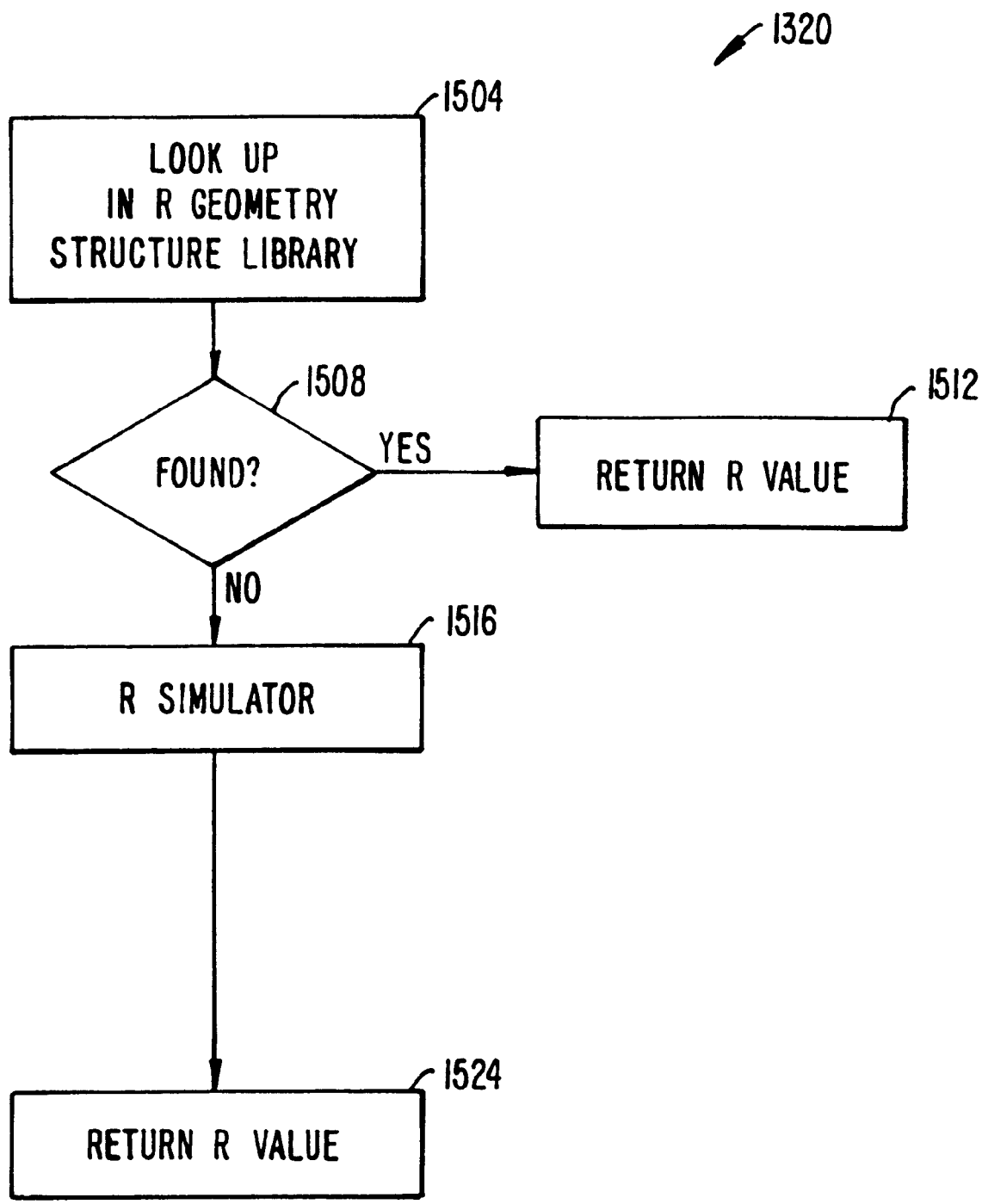
FIG. 15 is a flow diagram of the resistance value calculation method of the present invention.

FIG. 15 shows a more detailed flow diagram of calculate R value 1316 of FIG. 13. First, lookup in R geometry structure library 1504 consults the R geometry structure library 1416 of FIG. 14. If the selected structure, geometry, or net is found (found 1508) in the R geometry structure library 1416, this value is used (return R value 1512); no further extractions or calculations need to be performed.

If the selected geometry, structure, or net is not found (found 403), however, R simulator 1516 calculates the parasitic resistance of the selected geometry, structure, or net. The calculation of parasitic resistance may include totalling the number of squares of resistance and multiplying this by the resistance per square of the material. Furthermore, as discussed earlier, the simulator 1516 will take into account equipotential lines of current and irregularly shaped polygons.

After R simulator 1516, the calculated parasitic resistance value is returned (return R value 1524). In the main net-by-net R and C extract 1124 flow, the R geometry structure library 1416 will be updated with the parasitic resistance value calculated by R simulator 1516. This occurs during update new R and C geometry structure library 1328. However, in other embodiments of the present invention, this update may occur, instead, in the calculate R value 1320 flow between the R simulator 1516 and return R value 1624 steps. In subsequent runs through R value 1320, these parasitic resistances for these structures will be found in the R geometry structure library 1416 during lookup in R geometry structure library 1504. Therefore, R simulator 1516 does need to recalculate these previously extracted parasitics, improving the execution speed of the layout extraction system.

Figure 16:
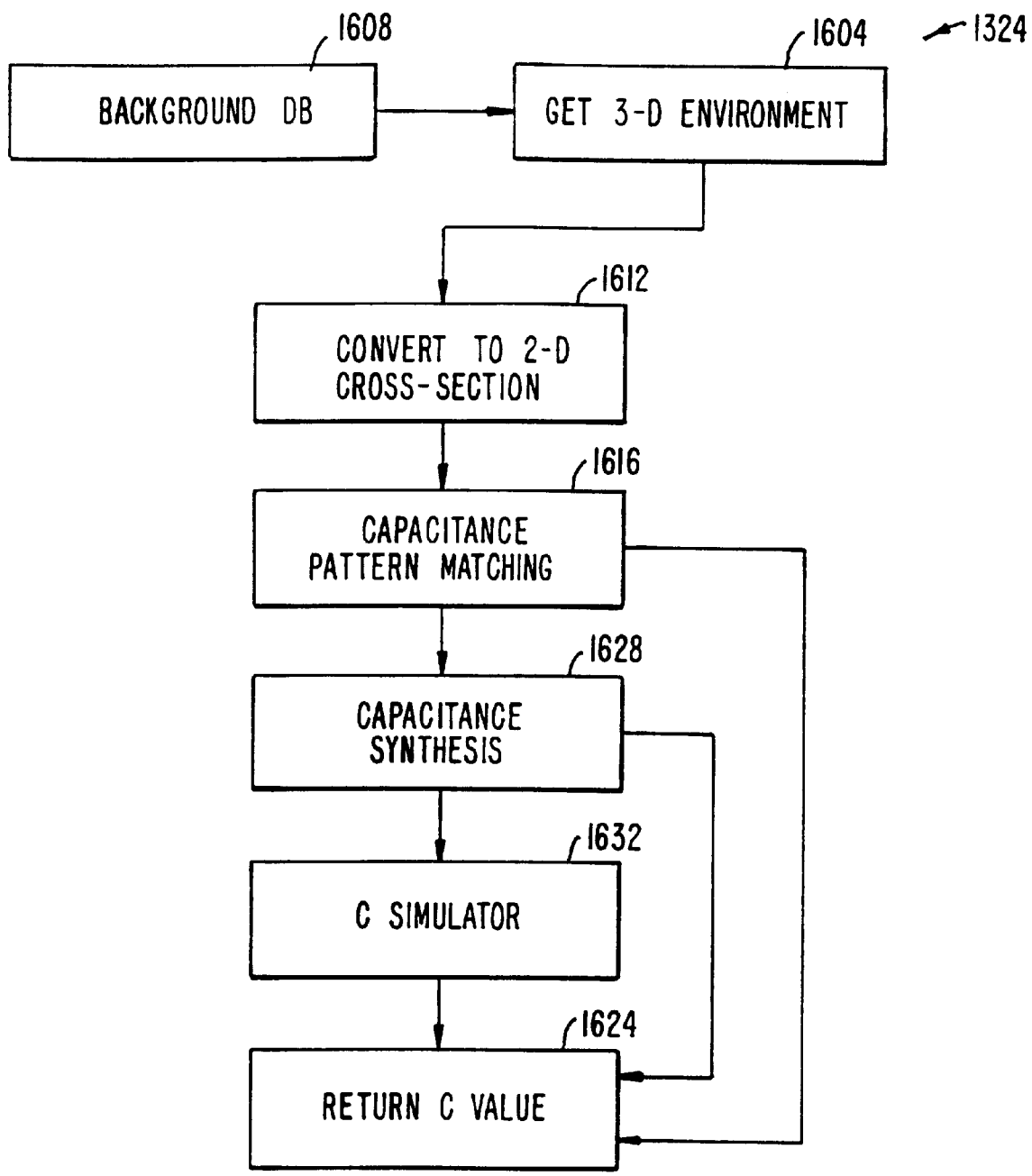
FIG. 16 is a flow diagram of the capacitance value calculation method of the present invention.

FIG. 16 shows a flow diagram of calculate C value 1324 of FIG. 13. Get 3-D environment 501 gets the three-dimensional environment information for the selected geometry, structure, or net. For parasitic capacitance, lateral, fringe, and area capacitances all contribute to the parasitic capacitance of a particular structure. For example, if there are three layers of metal interconnect surrounding a selected structure, each of these metal interconnect layers contribute some amount of lateral and fringe capacitance to the selected structure. Parasitic capacitance for a structure generally cannot be obtained solely from a single layer of a layout database.

Get 3-D environment 1604 determines which layers contribute to the parasitic capacitance (i.e., including fringe, area, and lateral effects) of a selected structure. Get 3-D environment 1604 uses the background database 1608 (i.e., background database 1116 of FIG. 11), which contains three-dimensional information about the geometries and structures surrounding a selected structure. This information is referred to as the 3-D environment.

In the present invention, get 3-D environment 1604 makes a determination of which geometries or structures contribute relatively weakly to the parasitic capacitance and excludes these from consideration. For example, if there are three layers of metal interconnect surrounding a selected structure, each of these metal interconnect layers contribute some amount of lateral and fringe capacitances, but one of these metal interconnects may be so much closer to the selected structure that it clearly dominates the parasitics. In this case, get 3-D environment 1604 will "throw away" (not consider) the capacitance effects from the other two metal interconnects because their values effects are comparably minimal. A threshold for deciding whether to consider a structure as part of an environment is if the parasitic capacitance contribution of that structure is less than one-tenth of the parasitic capacitance contribution of another structure. In other embodiments, capacitances less than one-hundredth of the dominant capacitance will not be considered. By only considering selected, relatively substantial parasitic capacitances, the present invention improves execution speeds, since only relevant parasitic capacitances are considered.

After the particular structures that contribute or effectively contribute capacitance to a selected structure are determined, convert to 2-D cross section 1612 converts this three-dimensional environment information into a two-dimensional cross-sectional structure. More specifically, convert to 2-D cross section 1612 finds the cross section (a "side view") for the particular structure.

The get 3-D environment 1604 and convert to 2-D cross section procedures are sometimes referred to as quasi-3-D capacitance modeling. This is a process of determining capacitances based on a compilation of orthogonal 2-D cross sections of an integrated circuit. A more detail description of this technique is given below. Furthermore, as part of convert to 2-D cross section 1612, a 2-D capacitance geometry statistical difference process may also be used to check the accuracy of the quasi-3-D capacitance modeling. In this process, the inaccuracies of a purely 2-D analysis of the capacitance are compared to the true 3-D environment. This is used to test the accuracy of the resulting 2-D model.

Capacitance pattern matching 1616 compares the cross-sectional structures against the C geometry structure library 1412 of FIG. 14. The C geometry structure library 1412 contains parasitic capacitance values for previously extracted structures. If the cross-section structure is found in the C geometry structure library 1412, processing proceeds to return C value 1624, and this parasitic capacitance value will be used.

However, if no match is found, the next step is C synthesis 1628. This step refers to the process of modeling parasitic capacitance effects, but excluding the effects of corners, bending, crossover, and arbitrary shapes. C synthesis calculates a "signature." This signature is unique for a specific structure of the layout. C synthesis 1628 consults a C synthesis table 1408 of FIG. 14, containing parasitic capacitances for predefined structures (having predefined signatures). If the calculated signature is found in the C synthesis table 1408, then the capacitance value for the predefined structure with the same signature will be returned and used (return C value 1624).

Even if an exact signature match is not found, the signature may substantially match a signature in the C synthesis table 1408. A substantial signature match may be a ninety percent or greater match. In other embodiments, the degree of signature correspondence may be eighty percent or greater. For substantial signature matches, C synthesis 1628 will calculate a parasitic capacitance value for that selected structure. More specifically, C synthesis 1628 performs this calculation by making an interpolation from structures with substantially similar signatures in the C synthesis table 1408. This interpolated value is returned and used (return C value 1624). In other embodiments of the present invention, capacitance synthesis 1628 may precede capacitance pattern matching 1616.

C simulator 1632 is used when there is no substantial signature match and the structure is not found in the C geometry structure library 1412. C simulator 1632 calculates the parasitic capacitance value for the structure through capacitance modeling and simulation techniques. Depending on the desired degree of accuracy, C simulator 1632 will perform one or more iterations. The capacitance modeling or simulation may also be performed by third party software. C simulator 1632 may use a field solver when critical capacitances are being modeled, although field solvers will generally slow down execution speed.

After C simulator 1632, the calculated parasitic capacitance value is returned (return C value 1624). In the main net-by-net R and C extract 1124 flow, the C geometry structure library 1412 will be updated with the parasitic capacitance value calculated by C simulator 1632. This occurs during update new R and C geometry structure library 1328. However, in other embodiments of the present invention, this update may occur, instead, in the calculate C value 1324 flow between the C simulator 1632 and return C value 1624 steps. In subsequent runs through C value 1324, these parasitic capacitances for these structures will be found in the C geometry structure library 1412 during capacitance pattern matching 1616. Therefore, C simulator 1632 does not need to recalculate these previously extracted parasitics, improving the execution speed of the layout extraction system.

Figure 17A:
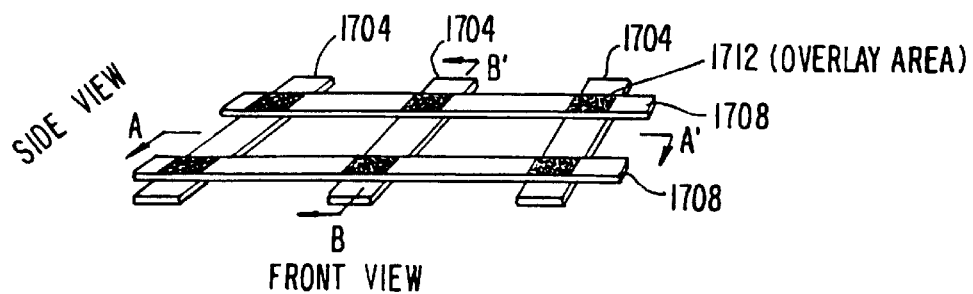
FIGS. 17A–B are graphical illustrations of the capacitance value calculation method of the present invention.
Figure 17B:
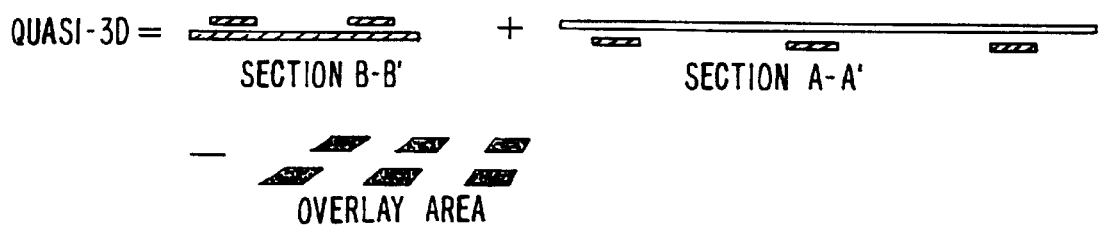

FIGS. 17A–B show graphical representations of the calculate C value 1324 procedure of present invention. FIG. 17A shows a result of get 3-D environment 1604. There are a plurality of first structures 1704 extending in first direction. There are a plurality of second structures 1708 extending in a second direction, above the first structures 1704. A plurality of overlay areas 1712 result from intersections of first structures 1704 and second structures 1708.

FIG. 17B shows the covert to 2-D cross-section routine. The capacitances are determined for a cross-section of the 3-D structure in a first direction (side view section B-B'). These are combined with the capacitances for a cross-section of the 3-D structure in a second direction (front view section A-A'). This second direction is orthogonal to the first direction.

FIGS. 18 through 22 are five functional blocks of a sample technology file. The technology file is read during read technology file 1404 of FIG. 14. These files include basic information about the semiconductor process and additional information about generating resistance and capacitance models. In one embodiment, there are five functional blocks of the technology file: system commands (see FIG. 18), display commands (see FIG. 19), library commands (see FIG. 20), technology commands (see FIG. 21), and connectivity commands (see FIG. 22).

System commands (see FIG. 18) are those commands that specify parameters such as the file names to extract and the output file names. Library commands (see FIG. 19) are the block of the technology file used to specify the R and C geometry model library files. Display commands (see FIG. 20) are the block of the technology file used to define how the layers in the layout database (usually in GDSII format file) correspond to the process layers (e.g., p-diffusion, contact, metal 1, metal 2). Technology commands (see FIG. 21) are the block of the technology file used to specify physical process parameters such as contact resistance, oxide thickness, metal thickness, and p-diffusion resistance. Connectivity commands (see FIG. 22) are the block of the technology file used to specify the sequence of semiconductor interconnect layers from bottom to top and defines how these layers connect with each other.

Figure 23A:
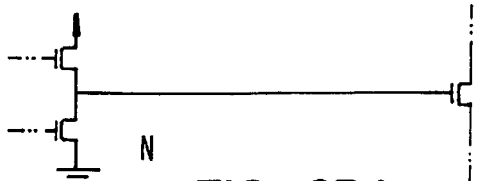
FIGS. 23A–J show circuit diagrams for ten network reduction models of the present invention.
Figure 23F:
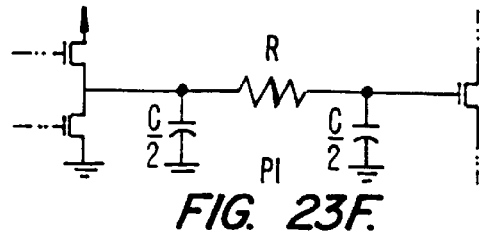
Figure 23B:
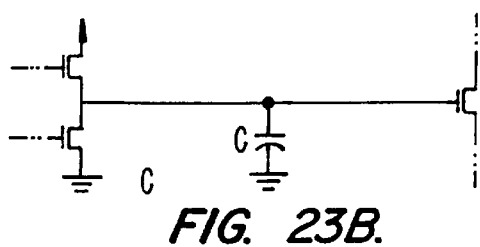
Figure 23G:
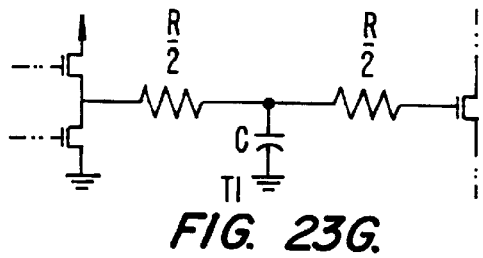
Figure 23C:
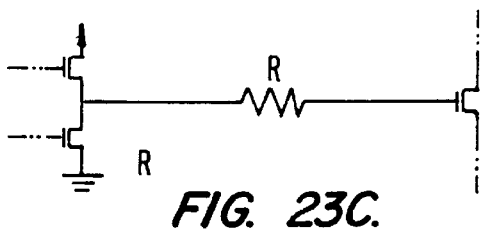
Figure 23H:
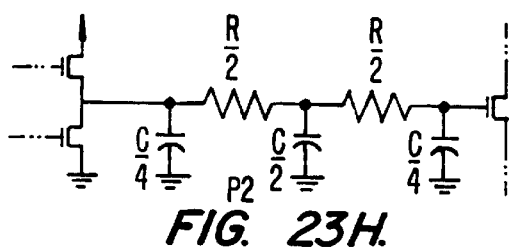
Figure 23D:
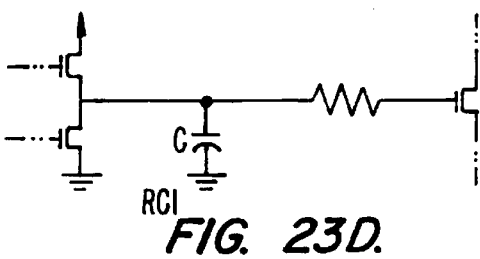
Figure 23I:
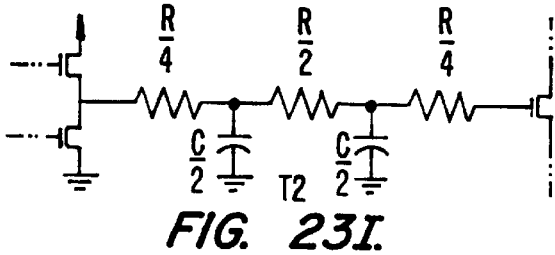
Figure 23E:
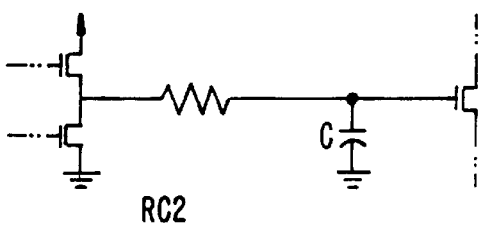

FIGS. 23A–J show distributed network reduction models of the present invention. Using a connectivity-based database, the present invention can extract lumped distributed RC networks. Lumped distributed RC networks allow for more accurate modeling of layout parasitics, especially for long nets. FIGS. 23A through 23J show circuit diagrams for ten network reduction models of the present invention. FIGS. 23A through 23E are useful for extremely simple or short nets. FIG. 23A shows an N model. This model does not have a resistance (R) or capacitance (C) in the net between the circuit elements. FIG. 23B shows a C model. In this model, a C to ground (representing the total capacitance of the net) is coupled to the net. FIG. 23C shows an R model, where there an R (representing the total resistance) in the net, between the circuit elements. FIG. 23D shows an RC1 model. In this model, a C to ground is coupled before a R between the circuit elements. FIG. 23E shows an RC2 model. In this model, a C to ground is coupled after a R between the circuit elements. These models in FIGS. 23A–E provide reasonable accuracy at modest computing costs for the simplest and lowest frequency nets.

FIGS. 23F through 23J are for more complex and longer nets. FIGS. 23G and 23I are T-network models. FIG. 23G is a T1 model. In this model, one C/2 to ground (representing half the capacitance of the net) is coupled before a R between the circuit elements and another C/2 to ground is coupled after the same R. FIG. 23I shows a T2 model. In this model, between the circuit elements, there is a R/4 (representing one-fourth the resistance of the net) coupled to a R/2 (representing one-half the resistance of the net), which is in turn, coupled to another R/4. Between each R/4 and R/2 connection is a C/2. At lower frequencies on a net, the T1 model may be used, while at the higher frequencies, the T2 model should be used for greater accuracy.

Figure 23J:
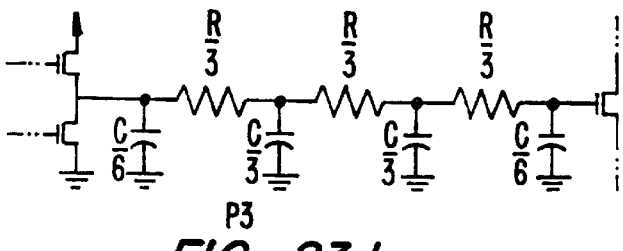

FIGS. 23F, 23H, and 23J are pi-network models. FIG. 23F shows a P1 model. In the P1 model, on either side of an R between the circuit elements is a C/2 to ground. FIG. 23H shows a P2 model, and FIG. 23J shows a P3 model. The P1 model is used for the lowest frequency nets. As the frequency of the signal on a net increases, the P2 or P3 model are used to provide greater accuracy.

Figure 24:
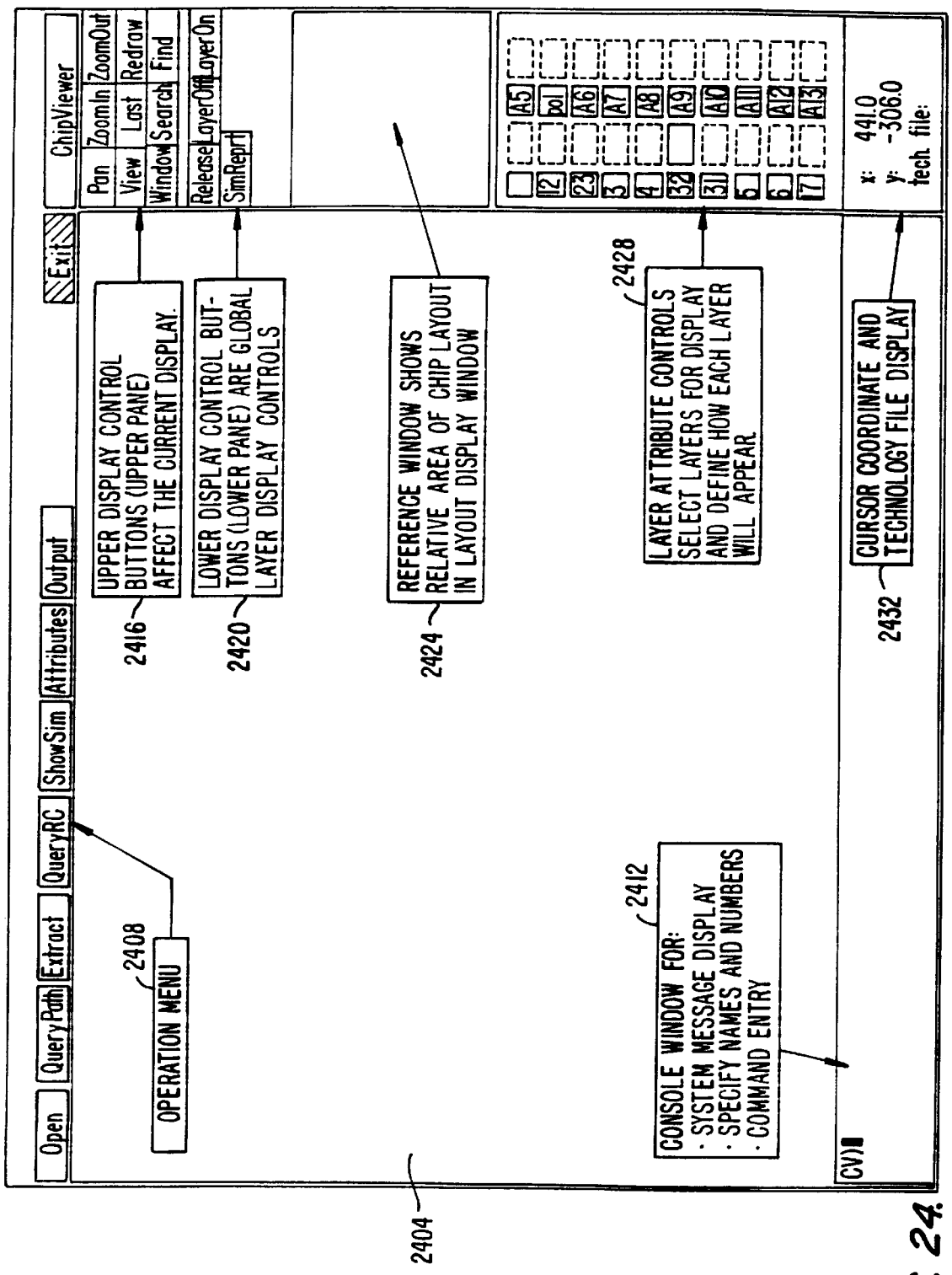
FIG. 24 shows a screen from a chip viewer graphical interface of the present invention.

FIG. 24 shows a screen from a chip viewer 1120 graphical interface of the present invention. Main chip layout display window 2404 can be used to display the circuit schematic or layout of the integrated circuit. A user selects commands from a menu-driven operation menu 2408. Alternatively, a user may type commands into the console window 2412. Console window 2412 is also used to display system messages and specify net names and numbers.

Upper display control buttons 2416 are used to manipulate the current display in the main chip layout display window 2404; the user can pan, zoom in, zoom out, redraw, search, find, view, and perform other such operations on the current display. Lower display control buttons 2420 are global layer display controls to control whether certain layers are shown.

Reference window 2424 shows the chip layout in the main chip layout display window 2404 relative to the entire cell, block, or integrated circuit. Layer attribute controls 2428 selects layers for display and define how each layer will appear (e.g., shading and color). Cursor coordinate and technology file display 2432 shows the current coordinates of the cursor and the name of the technology file being used.

Figure 25:
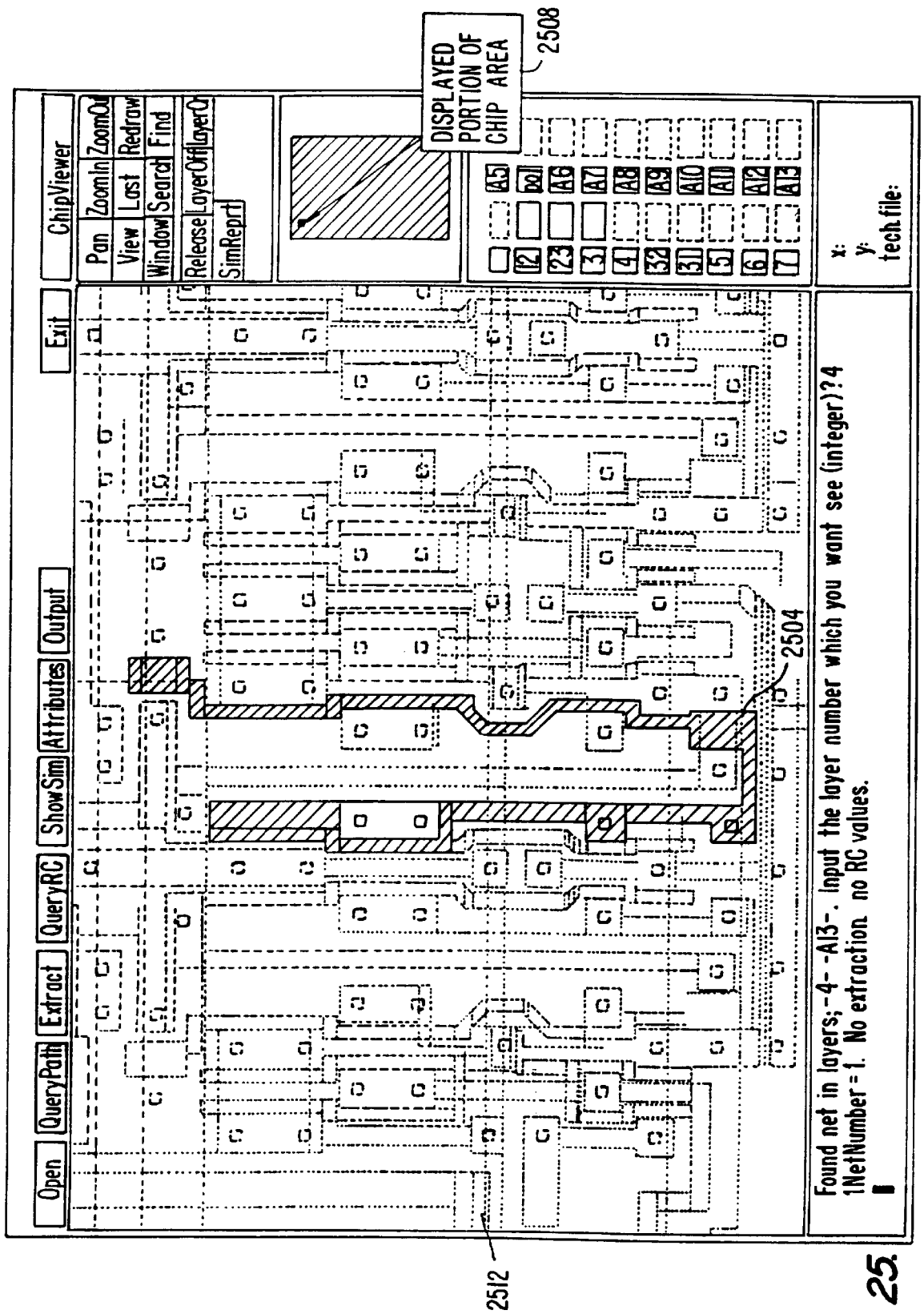
FIG. 25 shows a screen from a chip viewer graphical interface showing a selected net with the surrounding layout.

FIG. 25 shows a screen from a chip viewer 1120 graphical interface showing a selected net 2504 with the surrounding layout. Selected net 2504 is highlighted. The highlighting is selectable. On a color display, this highlighting may be in a white color or other differentiating color. Reference window 2508 shows the portion of the layout displayed portion in the main chip layout display window 2512 in relation to the entire integrated circuit area.

Figure 26:
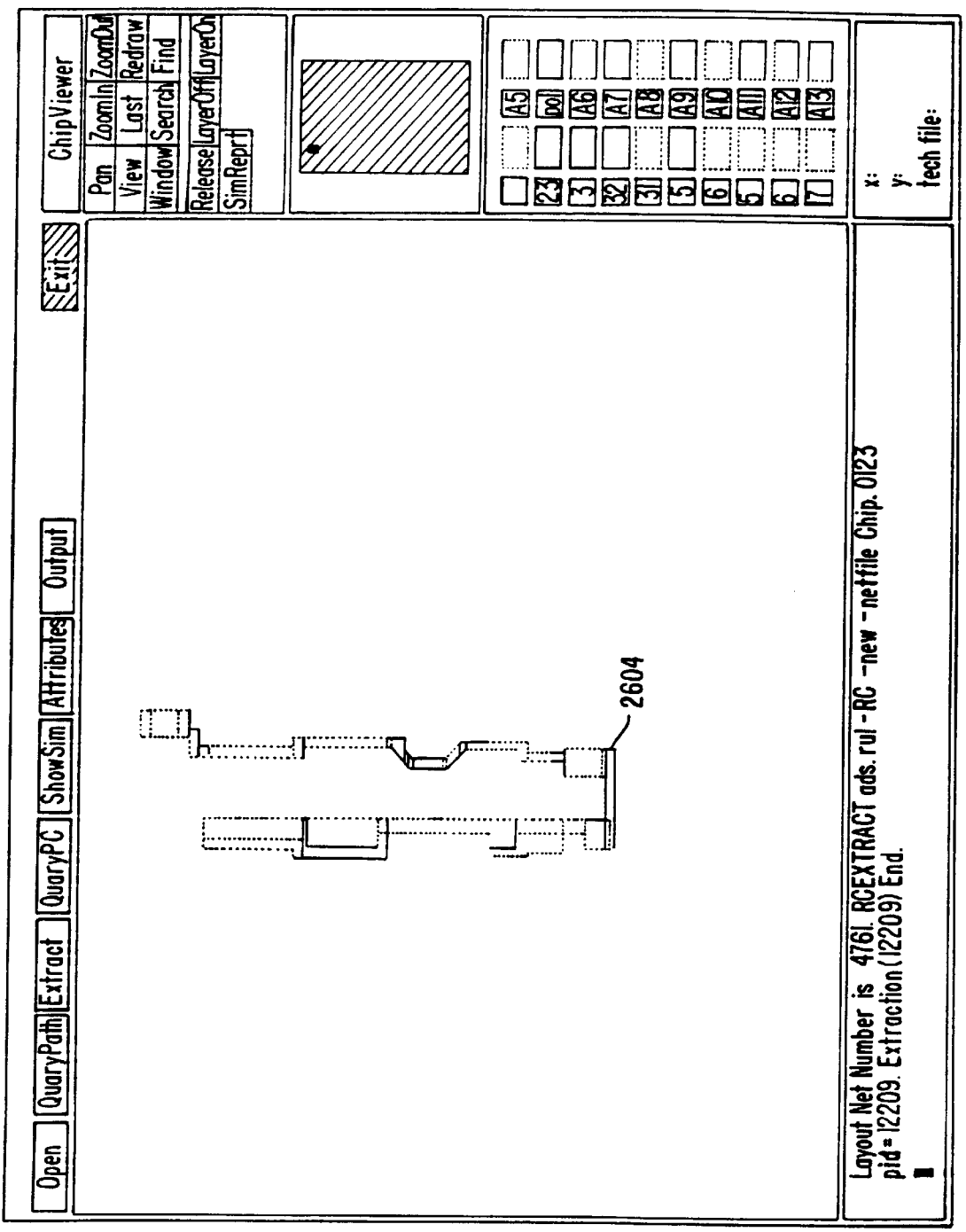
FIG. 26 shows a screen from a chip viewer graphical interface showing a selected net without the surrounding layout.

FIG. 26 shows a screen from a chip viewer 1120 graphical interface showing a selected net without the surrounding layout. Selected net 2604 is the same net as selected net 2504 of FIG. 25. In this embodiment, chip viewer 1120 can display selected net 2604 without the surrounding layout.

Figure 27:
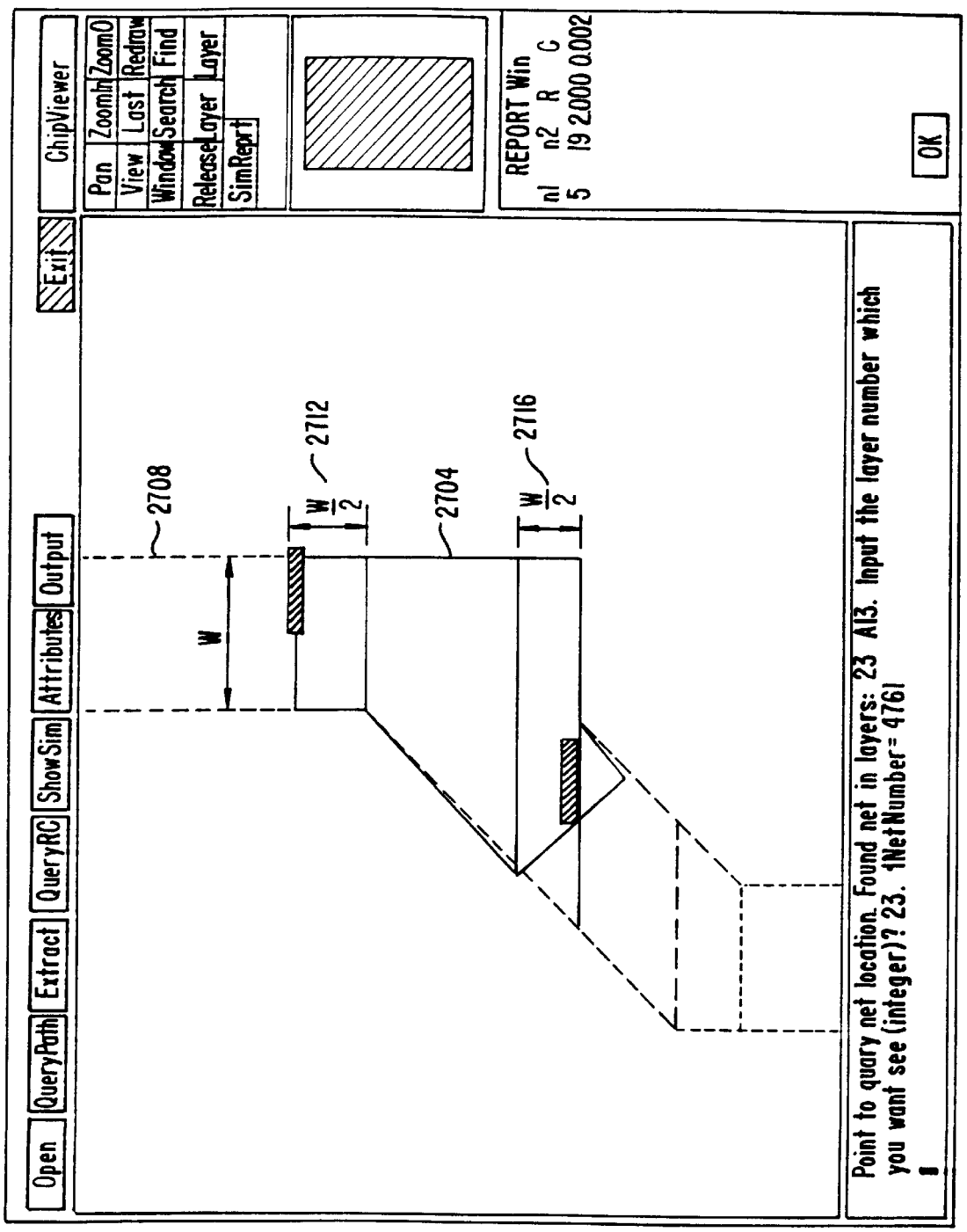
FIG. 27 shows a screen from a chip viewer graphical interface showing the selection of a highly irregular portion of a net.
Figure 28:
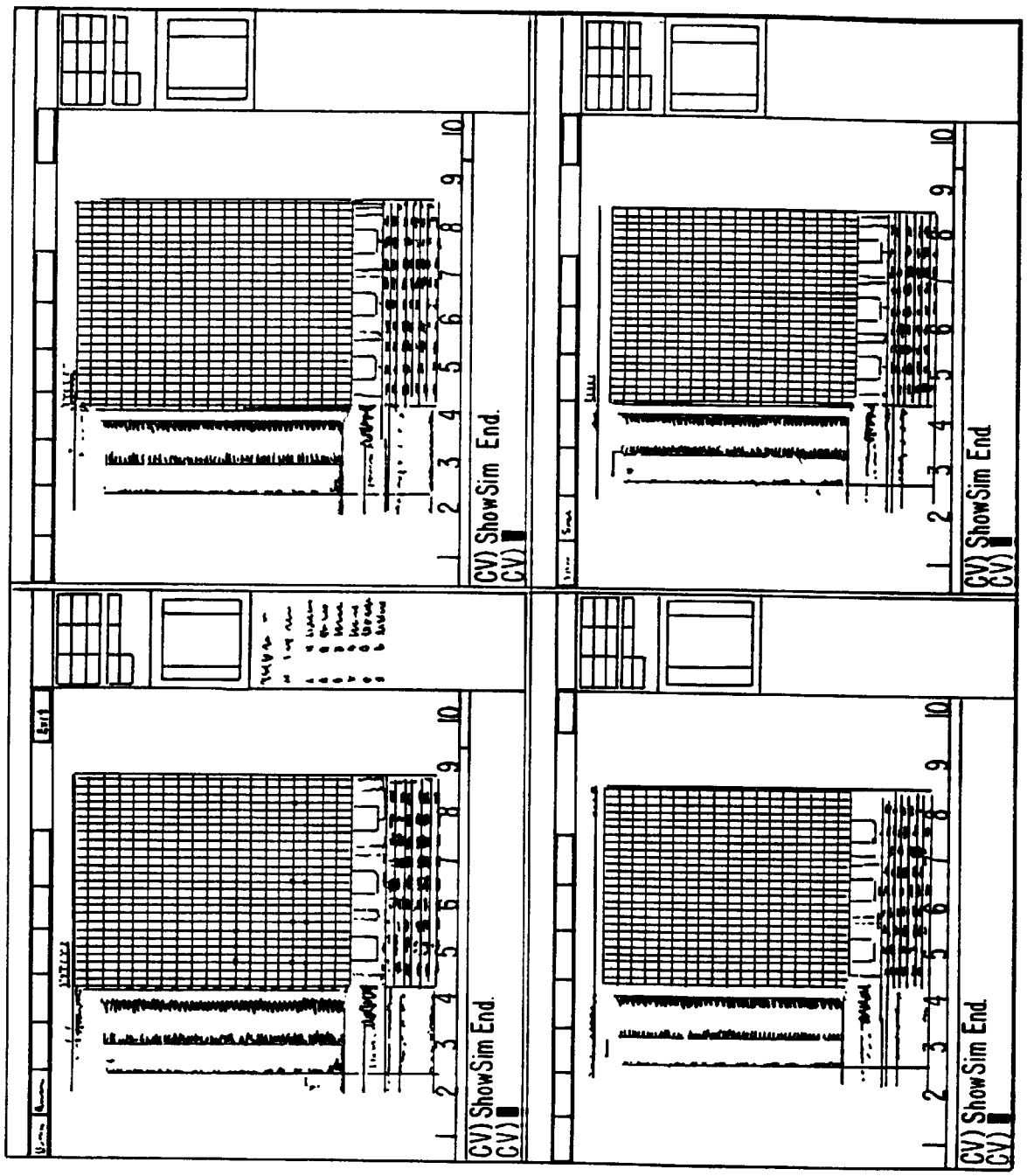
FIG. 28 shows four screens from software analyzing power distribution for an integrated circuit using the netlister output of the present invention.

FIG. 27 shows a screen from a chip viewer 1120 graphical interface showing the selection of a irregular (polygon) portion 2704 of net 2708. Furthermore, FIG. 27 shows how polygon decomposition 1316 of FIG. 13 breaks up an irregular polygon net to properly account for equipotential lines of current. This allows more accurate extraction of parasitic resistance data. First, the present invention determines the width (W) of net 2708. Then, the present invention breaks up irregular polygon 2704 at breakpoints 2712 and 2716, extending a distance W/2 in opposite directions from the irregular polygon. In the end, the decomposed polygon includes irregular polygon 2704 and two W/2 portions, 2712 and 2716. When extracted, this decomposed polygon will properly account for equipotential lines of current.

FIG. 27 shows four screens from software analyzing power distribution for an integrated circuit using output from netlister 1336 of FIG. 13 of the present invention. The screens in FIG. 27 show a power distribution simulation, which is useful in determining which nets and interconnects on an integrated circuit have an unusually high current density, leading to a electromigration problem.

Figure 29:
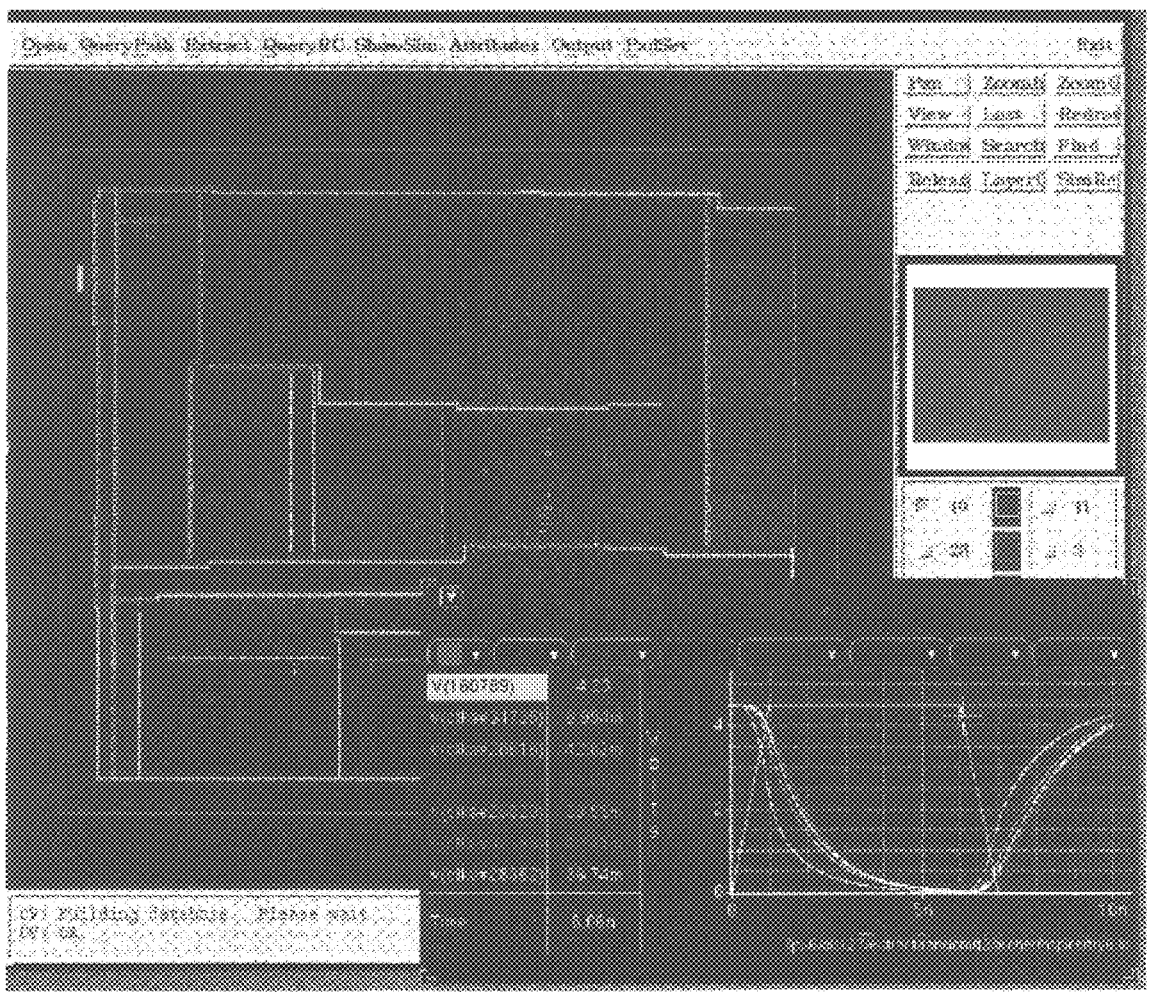
FIG. 29 shows a color screen from chip viewer of clock signal analysis of the present invention.

FIG. 29 shows a color screen from chip viewer 1120 of a clock signal analysis of the present invention. FIG. 29 shows how timing analysis is performed for an integrated circuit, after taking into account the layout parasitics on a clock net. The layout parasitics for the clock net were back annotated into the circuit schematic to allow circuit simulation.

Figure 30:
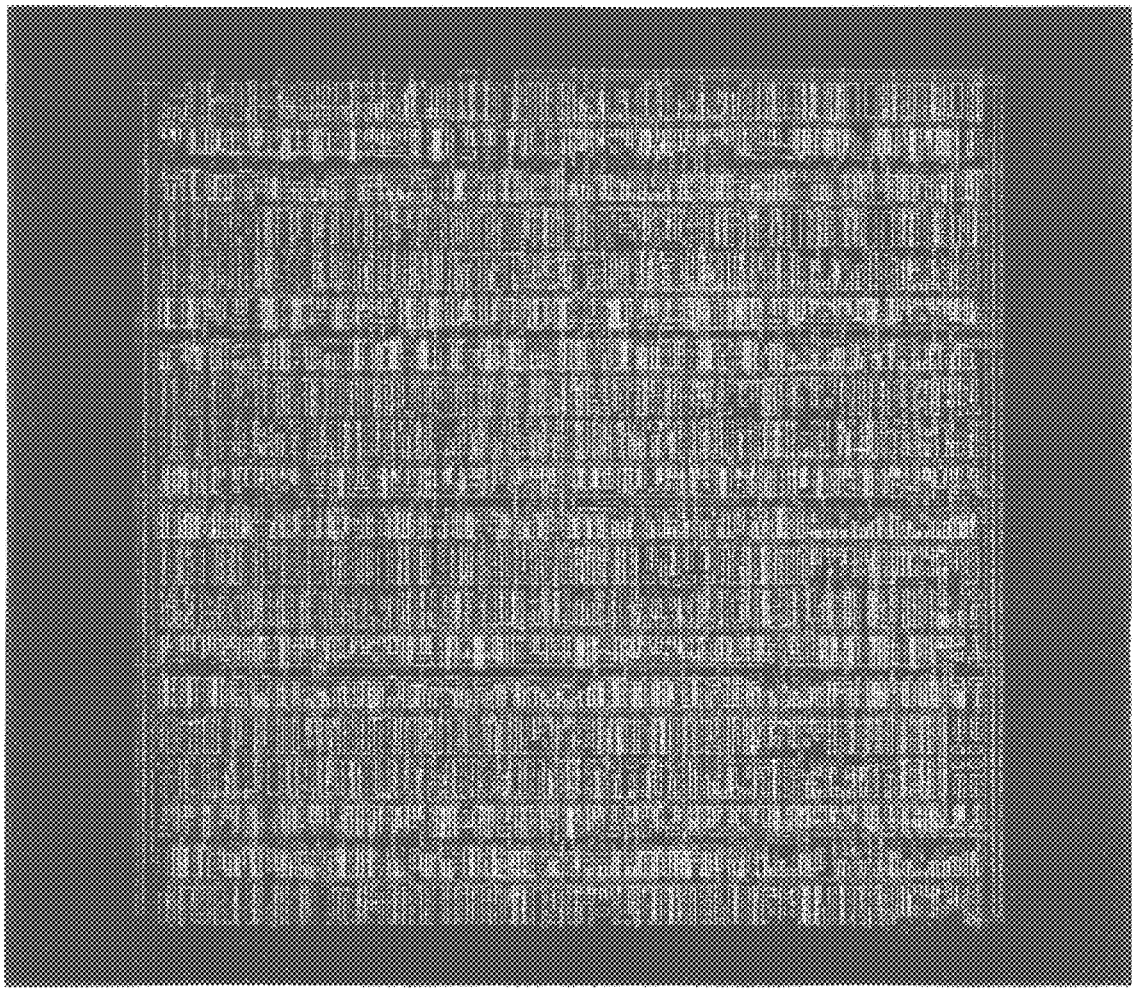
FIG. 30 shows a color screen from chip viewer of a place and route block of the present invention.

FIG. 30 shows a color screen from chip viewer 1120 of a place and route block of the present invention. FIG. 30 shows how chip viewer 1120 highlights a selected net (in magenta) that is routed through many blocks of an integrated circuit.

Figure 31:
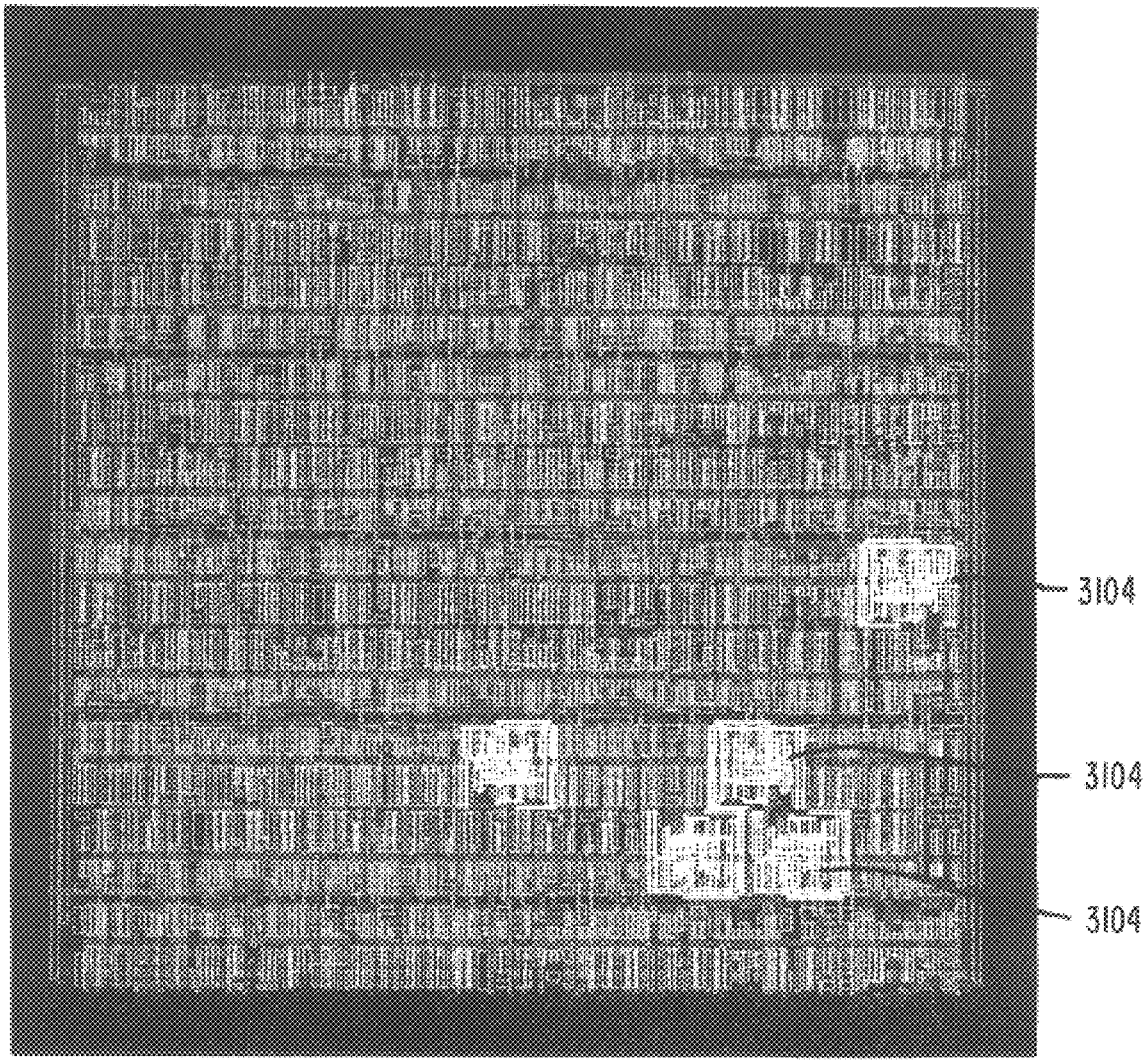
FIG. 31 shows a color screen from chip viewer of hierarchical block extraction of the present invention.

FIG. 31 shows a color screen from chip viewer 1120 of hierarchical block extraction of the present invention. FIG. 31 shows how chip viewer 1120 highlights (in white) a selected net 3104 that is routed through blocks of an integrated circuit. Further, net 3104 is contained on a hierarchical block. When a hierarchical block is selected (in white), all other similar blocks on the integrated circuit are selected (also in white).

Figure 32:
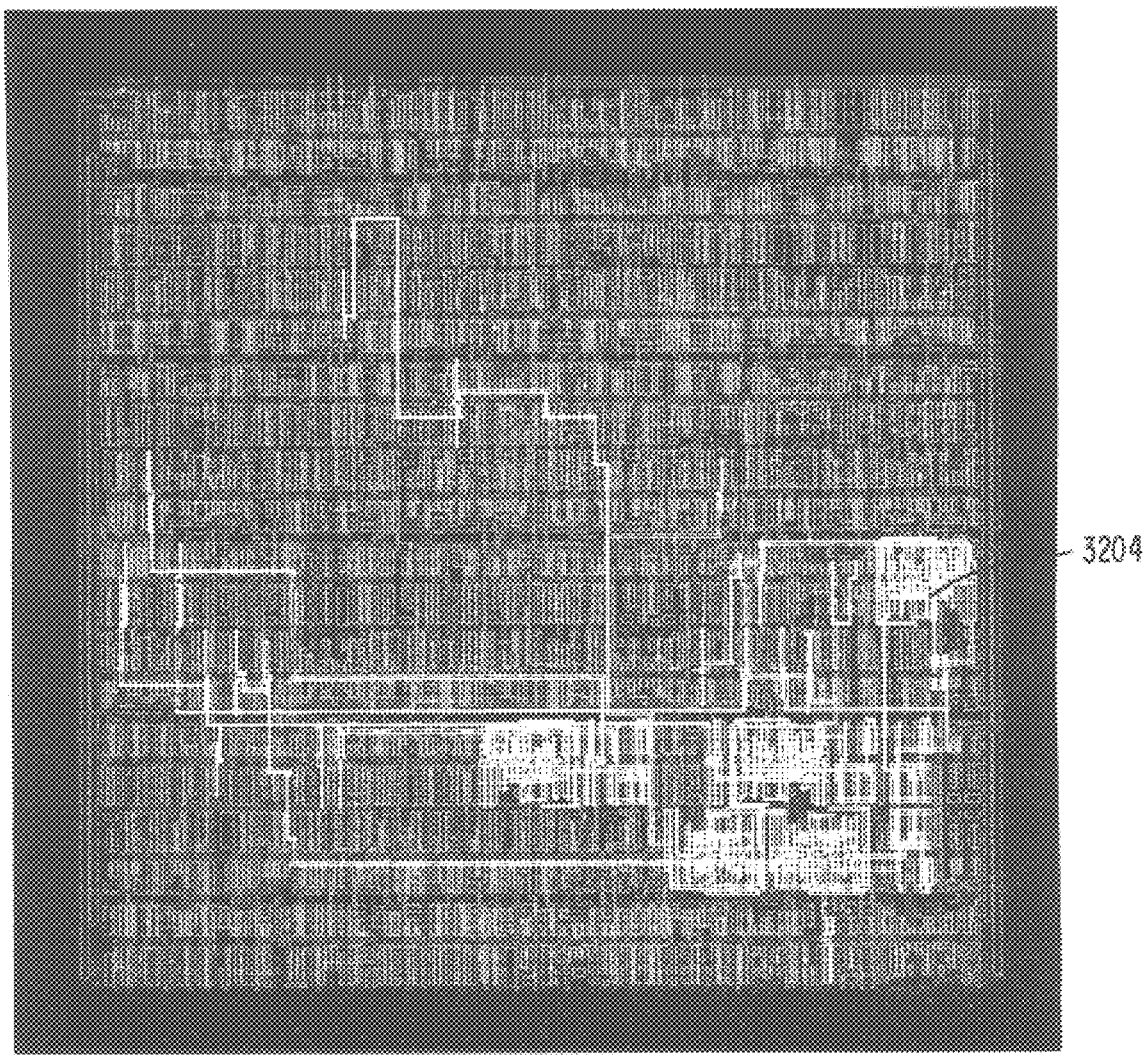
FIG. 32 shows a color screen from chip viewer of a hierarchical block and interconnect extraction.

FIG. 32 shows a color screen from chip viewer 1120 of a hierarchical block and interconnect extraction. FIG. 32 shows how chip viewer 1120 highlights (in white) a selected net 3204 that is routed through hierarchical blocks and other blocks of an integrated circuit. The present invention can extract layout parasitics for selected net 3204.

Figure 33:
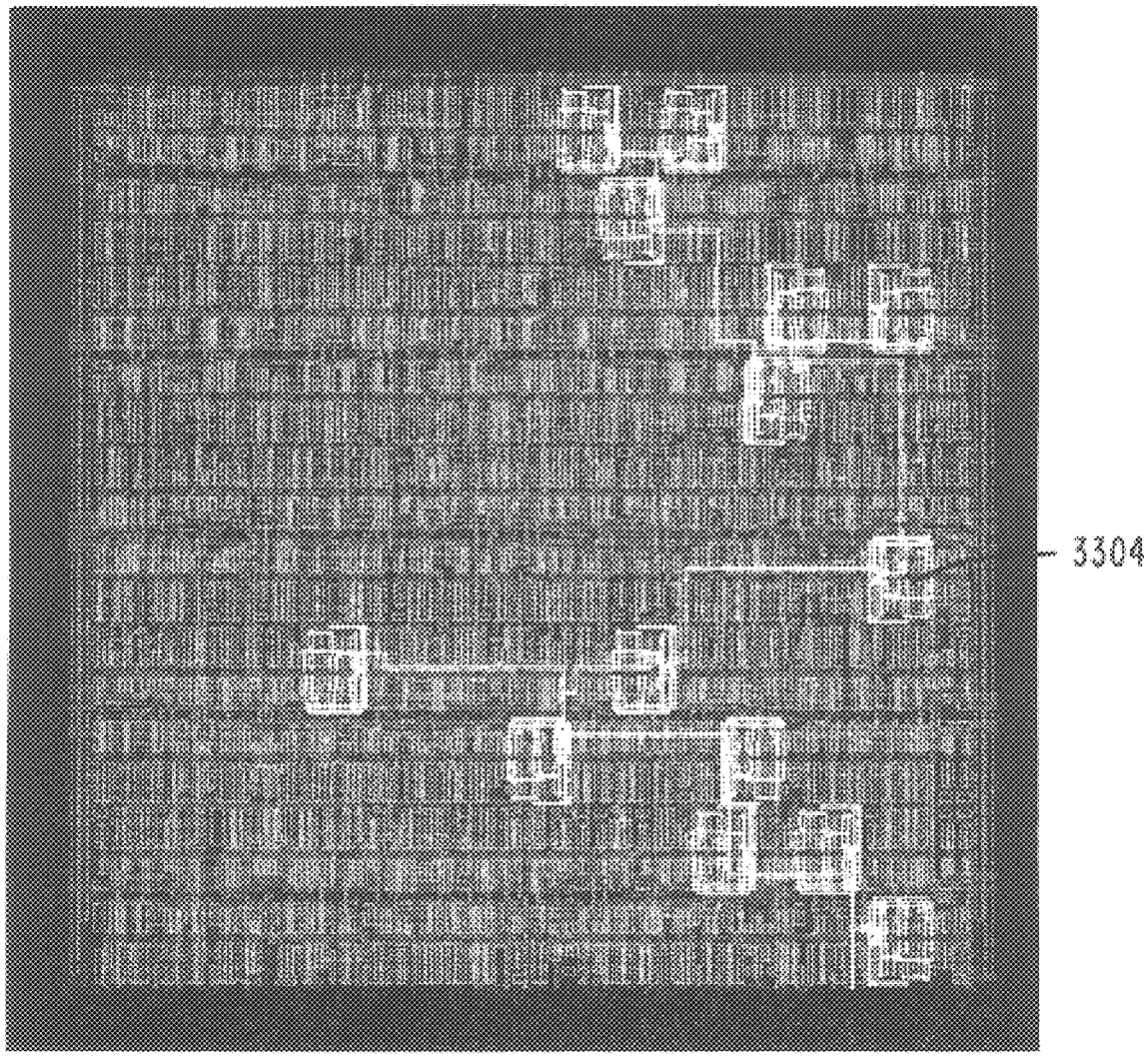
FIG. 33 shows a color screen from chip viewer of a clock tree extraction.

FIG. 33 shows a color screen from chip viewer 1120 of a clock tree extraction. FIG. 33 shows how chip viewer 1120 highlights (in white) a selected net 3304 that is routed through blocks of an integrated circuit. Net 3304 is a clock net. The present invention can perform a layout parasitics extraction on the clock tree of net 3304.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A method of designing an integrated circuit comprising the steps of:
   inputting a design schematic into a programmed digital computer;
   inputting a layout representation of said design schematic into said programmed digital computer;
   in said programmed digital computer, creating a connectivity-based database wherein a plurality of geometries in said layout representation are referenced by a plurality of nets of said design schematic;
   in said programmed digital computer, extracting layout parasitics for at least one of said plurality of nets by using said connectivity-based database comprising the steps of:
      selecting at least one net from said plurality of nets;
      in said programmed digital computer, decomposing said at least one selected net into polygon subsections;
      from said decomposed polygon subsections, determining layout parasitics for one of said at least one selected net of said design schematic of said plurality of nets; and
      repeating said step of determining layout parasitics until layout parasitics for said at least one selected net of said design schematic have been calculated; and
   designing said integrated circuit.

2. The method of designing an integrated circuit of claim 1 wherein said decomposing step comprises the steps of:
   determining a width, W, of a regular polygon touching an irregular polygon; and
   creating a polygon subsection including said irregular polygon and portions of said regular polygon extending approximately a distance of W/2 in at least two directions from said irregular polygon, said polygon subsection accounting for equipotential lines of current.

3. A method of designing an integrated circuit comprising the steps of:
   inputting a design schematic into a programmed digital computer;
   inputting a layout representation of said design schematic into said programmed digital computer;
   in said programmed digital computer, creating a connectivity-based database wherein a plurality of geometries in said layout representation are referenced by a plurality of nets of said design schematic;
   in said programmed digital computer, extracting layout parasitics for at least one of said plurality of nets by using said connectivity-based database comprising the steps of:
      selecting a net from said plurality of nets of said design schematic;
      determining layout resistance parasitics for said selected net of said plurality of nets of said design schematic;
      determining layout capacitance parasitics for said selected net of said plurality of nets of said design schematic; and
      repeating said steps of determining layout resistance parasitics and determining capacitance parasitics until parasitics for nets of said design schematic have been extracted; and
   designing said integrated circuit.

4. A method of extracting layout parasitics for an integrated circuit comprising the steps of:
   selecting at least one net from a plurality of nets;
   generating a parasitic structure representation for said selected net from said plurality of nets;
   comparing said parasitic structure representation against a plurality of predefined structures in a predefined geometry library, said predefined geometry library containing a plurality of predefined parasitic values for said plurality of predefined structures; and
   selecting as an extracted parasitic value, one of said plurality of predefined values from said predefined geometry library if said parasitic structure representation is similar to one of said plurality of predefined structures.

5. The method of extracting layout parasitics for an integrated circuit of claim 4 further comprising the steps of:
   calculating said extracted parasitic value using said parasitic structure representation if said parasitic structure representation is not similar to one of said plurality of predefined structures; and
   updating said predefined geometry library with said parasitic structure representation and said extracted parasitic value from said calculation step.

6. The method of extracting layout parasitics for an integrated circuit of claim 4 wherein said extracted parasitic value is a parasitic resistance.

7. The method of extracting layout parasitics for an integrated circuit of claim 4 wherein said extracted parasitic value is a parasitic capacitance.

8. A method of extracting layout parasitics for an integrated circuit comprising the steps of:

selecting at least one net from said plurality of nets;

generating a cross-sectional structure for said selected net from a connectivity-based database;

using said connectivity-based database, generating a signature value for said cross-sectional structure;

comparing said signature value against a plurality of predefined signature values in a capacitance synthesis table, said capacitance synthesis table containing said plurality of predefined signature values for a plurality of predefined capacitance values; and selecting as an extracted parasitic capacitance value one of said plurality of predefined capacitance values from said capacitance synthesis table if said signature value is similar to one of said plurality of predefined signature values.

9. The method of extracting layout parasitics for an integrated circuit of claim 8 further comprising the steps of:

interpolating for said extracted parasitic capacitance value using said capacitance synthesis table if said signature value is not similar to one of said plurality of predefined signature values.

10. A method of designing an integrated circuit further comprising the steps of:

inputting a design schematic into a programmed digital computer;

inputting a layout representation of said design schematic into said programmed digital computer;

in said programmed digital computer, creating a connectivity-based database wherein a plurality of geometries in said layout representation are referenced by a plurality of nets of said design schematic;

in said programmed digital computer, extracting layout parasitics for at least one of said plurality of nets by using said connectivity-based database comprising the steps of:

selecting at least one net from said plurality of nets;

in said programmed digital computer, decomposing said at least one selected net into polygon subsections;

from said decomposed polygon subsections, determining layout parasitics for one of said at least one selected net of said design schematic of said plurality of nets; and repeating said step of determining layout parasitics until layout parasitics for said at least one selected net of said design schematic have been calculated;

designing said integrated circuit; and fabricating said integrated circuit.

11. A method of designing an integrated circuit comprising the steps of:

inputting a circuit schematic into a programmed digital computer;

creating a circuit schematic database from said design schematic using said programmed digital computer;

inputting a layout representation of said circuit schematic into said programmed digital computer;

creating a layout database from said layout representation using said programmed digital computer;

in said programmed digital computer, creating a connectivity-based database from said circuit schematic database and said layout database, wherein said connectivity-based database comprises a plurality of geometries of said layout database that are referenced by a plurality of nets of said circuit schematic;

selecting at least one net from said plurality of nets of said circuit schematic; and in said programmed digital computer, extracting layout parasitics for said selected net using said connectivity-based database, wherein said extracting step comprises the steps of:

using said connectivity-based database, determining parasitic resistances for said selected net of said circuit schematic;

using said connectivity-based database, determining parasitic capacitances for said selected net of said circuit schematic; and repeating said step of determining parasitic resistances and step of determining parasitic capacitances until parasitics for said selected net have been extracted.

12. The method of designing an integrated circuit of claim 11 further comprising the steps of:

updating a resistance geometry structure library with parasitic resistances not previously extracted; and updating a capacitance geometry structure library with parasitic capacitances not previously extracted.

13. A method of extracting layout parasitics for an integrated circuit, said method comprising:

inputting a design schematic into a programmed digital computer;

inputting a layout representation of said design schematic into said programmed digital computer;

in said programmed digital computer, creating a connectivity-based database wherein a plurality of geometries in said layout representation are referenced by a plurality of nets of said design schematic;

in said programmed digital computer, extracting parasitic capacitance data for at least one of said plurality of nets by using said connectivity-based database comprising:

selecting a net from said plurality of nets of said design schematic;

determining geometries for said selected net from said connectivity-based database;

reading a capacitance synthesis table having predefined parasitic capacitance values for predefined capacitance structures;

comparing said geometries for said selected net against said predefined capacitance structures in said capacitance synthesis table; and selecting one of said predefined parasitic capacitance values if said geometries for said selected net match one of said predefined capacitance structures; and repeating said extracting parasitic capacitance data until parasitics for nets of said design schematic have been extracted.

14. A method of extracting layout parasitics for an integrated circuit, said method comprising:

inputting a design schematic into a programmed digital computer;

inputting a layout representation of said design schematic into said programmed digital computer;

in said programmed digital computer, creating a connectivity-based database wherein a plurality of geometries in said layout representation are referenced by a plurality of nets of said design schematic;

in said programmed digital computer, extracting parasitic resistance data for at least one of said plurality of nets by using said connectivity-based database comprising:

selecting a net from said plurality of nets of said design schematic;

determining geometries for said selected net from said connectivity-based database;

reading a resistance geometry library having predefined parasitic resistance values for predefined resistance structures;

comparing said geometries for said selected net against said predefined resistance structures in said resistance geometry library; and selecting one of said predefined parasitic resistance values if said geometries for said selected net match one of said predefined resistance structures; and repeating said extracting parasitic resistance data until parasitics for nets of said design schematic have been extracted; and designing said integrated circuit.

* * * * *